US009899877B2

(12) United States Patent
Mitcheson et al.

(10) Patent No.: US 9,899,877 B2
(45) Date of Patent: Feb. 20, 2018

(54) INDUCTIVE POWER TRANSFER SYSTEM

(71) Applicant: Drayson Technologies (Europe) Limited, London (GB)

(72) Inventors: Paul Mitcheson, London (GB); Stepan Lucyszyn, London (GB); Manuel Pinuela Rangel, London (GB); David Yates, London (GB)

(73) Assignee: Drayson Technologies (Europe) Limited, London (GB)

( * ) Notice: Subject to any disclaimer, the term of this patent is extended or adjusted under 35 U.S.C. 154(b) by 300 days.

(21) Appl. No.: 14/423,387

(22) PCT Filed: May 31, 2013

(86) PCT No.: PCT/GB2013/051456
§ 371 (c)(1),
(2) Date: Feb. 23, 2015

(87) PCT Pub. No.: WO2014/029961
PCT Pub. Date: Feb. 27, 2014

(65) Prior Publication Data
US 2015/0207334 A1 Jul. 23, 2015

(30) Foreign Application Priority Data

Aug. 24, 2012 (GB) .................................. 1215152.8
May 30, 2013 (GB) .................................. 1309691.2

(51) Int. Cl.
*H01F 37/00* (2006.01)
*H01F 38/14* (2006.01)
(Continued)

(52) U.S. Cl.
CPC .............. *H02J 50/12* (2016.02); *G01R 31/04* (2013.01); *H01F 38/14* (2013.01); *H02J 5/005* (2013.01);
(Continued)

(58) Field of Classification Search
CPC . H02J 5/005; H02J 7/025; H02J 17/00; G01R 31/04; H01F 38/14;
(Continued)

(56) References Cited

U.S. PATENT DOCUMENTS 1,119,732 A    12/1914   Tesla
5,200,672 A    4/1993   Sheynberg et al. ........... 315/248
(Continued)

FOREIGN PATENT DOCUMENTS

CA   2 715 937 A1   9/2010   ............... B60N 2/44
EP   0 503 862 A2   3/1992   ............ H02M 3/337
(Continued)

OTHER PUBLICATIONS

"Agilent N2780A/B, N2781A/B, N2782A/B, and N2783A/B Current Probes, User's and Service Guide", Agilent Technologies, Inc., Fifth Edition, U.S.A., 46 pages, Aug. 2010.
(Continued)

*Primary Examiner* — Hal Kaplan
(74) *Attorney, Agent, or Firm* — Sunstein Kann Murphy & Timbers LLP

(57) ABSTRACT

An inductive power transfer system comprises a transmitter circuit comprising a transmitter coil and a receiver circuit comprising a receiver coil spaced from the transmitter coil. The transmitter circuit is in the form of a Class E amplifier with a first inductor and a transistor in series between the terminals of a power supply. A first transmitter capacitance is in parallel with the transistor between the first inductor and a power supply terminal, a primary tank circuit in parallel with the first transmitter capacitance, the primary tank circuit comprising the transmitter coil and a second transmitter capacitance arranged in parallel with the transmitter coil, and a third transmitter capacitance in series with the first inductor between the first transmitter capacitance (Continued)

and the primary tank circuit. The second transmitter capacitance is selected such that a resonant frequency of the primary tank circuit is not equal to the first frequency.

47 Claims, 12 Drawing Sheets

(51) Int. Cl.

| | |
|---|---|
| H02J 5/00 | (2016.01) |
| H02J 17/00 | (2006.01) |
| H02J 50/12 | (2016.01) |
| H02J 50/90 | (2016.01) |
| H03F 3/217 | (2006.01) |
| G01R 31/04 | (2006.01) |
| H02J 7/02 | (2016.01) |
| H02M 7/537 | (2006.01) |
| H02M 7/48 | (2007.01) |

(52) U.S. Cl.
CPC .............. *H02J 7/025* (2013.01); *H02J 17/00* (2013.01); *H02J 50/90* (2016.02); *H02M 7/537* (2013.01); *H03F 3/2176* (2013.01); *H02M 2007/4815* (2013.01); *Y02B 70/1441* (2013.01); *Y02B 70/1483* (2013.01)

(58) Field of Classification Search
CPC ....... H01F 2038/143–2038/146; H02M 7/537; H02M 2007/4815; H03F 3/2176; Y02T 90/122; A61N 1/3787; Y02B 70/1441; Y02B 70/1483; H04B 5/0025–5/0093; B60L 11/182; B60L 11/1829–11/1831; A61B 1/00029
USPC .......................................... 307/104; 320/108
See application file for complete search history.

(56) References Cited

U.S. PATENT DOCUMENTS

| | | | |
|---|---|---|---|
| 5,327,337 A | 7/1994 | Cripe | 363/137 |
| 5,525,871 A | 6/1996 | Bray et al. | 315/248 |
| 7,956,572 B2 | 6/2011 | Zane et al. | 320/108 |
| 2002/0101284 A1 | 8/2002 | Kee et al. | 330/251 |
| 2007/0145830 A1 | 6/2007 | Lee et al. | 307/135 |
| 2009/0218884 A1 | 9/2009 | Soar | 307/11 |
| 2010/0109443 A1 | 5/2010 | Cook et al. | 307/104 |
| 2010/0123451 A1 | 5/2010 | Freer | 323/356 |
| 2010/0184371 A1 | 7/2010 | Cook et al. | 455/41.1 |
| 2010/0283327 A1 | 11/2010 | Buschnakowski et al. | 307/104 |
| 2011/0046699 A1 | 2/2011 | Mazanec | 607/61 |
| 2011/0080056 A1 | 4/2011 | Low et al. | 307/104 |
| 2011/0084656 A1 | 4/2011 | Gao | 320/108 |
| 2011/0089894 A1 | 4/2011 | Soar | 320/108 |
| 2011/0221278 A1 | 9/2011 | Karalis et al. | 307/104 |
| 2012/0032632 A1 | 2/2012 | Soar | 320/108 |
| 2012/0062345 A1 | 3/2012 | Kurs et al. | 333/235 |
| 2012/0161538 A1 | 6/2012 | Kinoshita et al. | 307/104 |
| 2012/0206097 A1 | 8/2012 | Soar | 320/108 |
| 2012/0223589 A1 | 9/2012 | Low et al. | |
| 2012/0235636 A1 | 9/2012 | Partovi | |
| 2013/0005251 A1 | 1/2013 | Soar | 455/41.1 |
| 2013/0015813 A1 | 1/2013 | Kim et al. | 320/108 |
| 2013/0188408 A1 | 7/2013 | Yamamoto | |
| 2014/0252877 A1 | 9/2014 | Turki | |

FOREIGN PATENT DOCUMENTS

| | | | | |
|---|---|---|---|---|
| EP | 0 643 900 A1 | 3/1995 | ............. | H05B 41/24 |
| GB | 2493671 A | 2/2013 | ............. | G01N 27/02 |
| JP | 7-143750 A | 6/1995 | ............. | H02M 7/06 |
| JP | 2012-503469 A | 2/2012 | ............. | H02J 17/00 |
| SG | 182745 A1 | 8/2012 | ............. | H02J 17/00 |
| WO | WO 2007/000055 A1 | 1/2007 | ............. | H02J 7/00 |
| WO | WO 2009/070730 A2 | 6/2009 | ............. | H02J 17/00 |
| WO | WO 2010/033727 A2 | 3/2010 | ............. | H02J 7/02 |
| WO | WO 2010/137495 A1 | 12/2010 | ............. | H02J 17/00 |
| WO | WO 2011/044695 A1 | 4/2011 | ............. | H02J 17/00 |
| WO | WO 2011/091528 A1 | 8/2011 | ............. | H02J 17/00 |
| WO | WO 2011/134068 A1 | 11/2011 | ............. | G01N 27/20 |
| WO | WO 2012/016336 A2 | 2/2012 | | |
| WO | WO 2012/027824 A1 | 3/2012 | ............. | H02J 17/00 |
| WO | WO 2012/092183 A2 | 7/2012 | ............. | H02J 17/00 |
| WO | WO 2013/014521 A1 | 1/2013 | ............. | H03F 3/217 |
| WO | WO 2014/029961 A1 | 2/2014 | ............. | H02J 17/00 |

OTHER PUBLICATIONS

"Delphi Wireless Charging System", http://delphi.com/shared/pdf/ppd/pwrelec/wireless-charging-system.pdf, May 2012.
Ahn et al., "Magnetic field design for high efficient and low EMF wireless power transfer in on-line electric vehicle", Proc. of the 5th European Conf. on Antennas and Propag. (EUCAP), pp. 3979-3982, Apr. 2011.
Balanis, "Antenna Theory: Analysis and Design", Third Edition, John Wiley, 1166 pages, Apr. 2005.
Budhia et al. "Design and optimization of circular magnetic structures for lumped inductive power transfer systems", IEEE Transactions on Power Electronics, vol. 26, No. 11, pp. 3096-3108, Nov. 2011.
Butterworth, "On the Alternating Current Resistance of Solenoidal Coils", Proceedings of the Royal Society of London, Series A, Containing Papers of a Mathematical and Physical Character, vol. 107, No. 744, pp. 693-715, Apr. 1925.
Casanova et al., "Design and optimization of a Class-E amplifier for a loosely coupled planar wireless power system", IEEE Transactions on Circuits and Systems—II: Express Briefs, vol. 56, No. 11, pp. 830-834, Nov. 2009.
Chen et al., "An optimizable circuit structure for high-efficiency wireless power transfer", IEEE Transactions on Industrial Electronics, vol. 60, No. 1, pp. 339-349, Jan. 2013.
Covic et al., "The design of a contact-less energy transfer system for a people mover system", Proceedings PowerCon 2000, International Conference on Power System Technology, vol. 1, pp. 79-84, Dec. 2000.
Duong et al., "Experimental results of high-efficiency resonant coupling wireless power transfer using a variable coupling method", IEEE, Microwave Wireless Components Letters., vol. 21, No. 8, pp. 442-444, Aug. 2011.
Erickson et al., "Design of a Simple High-Power-Factor Rectifier Based on the Flyback Converter", APEC '90, Conference Proceedings of Fifth Annual Applied Power Electronics Conference and Exposition, pp. 792-801, Mar. 11-16, 1990.
Erickson et al., "Fundamentals of Power Electronics—Second Edition," Kluwer Academic Publishers, 881 pages, 2004.
Finkenzeller, "RFID Handbook, Fundamental and Applications in Contactless Smart Cards, Radio Frequency Identification and Near-Field Communication—Third Edition", Wiley, ISBN 0-470-84402-7, 480 pages, 2010.
Garnica et al., "High efficiency midrange wireless power transfer system", Microwave Workshop Series on Innovative Wireless Power Transmission: Technologies, Systems, and Applications (IMWS), IEEE MTT-S International, pp. 73-76, May 12-13, 2011.
Grebennikov, "High-efficiency class E/F lumped and transmission-line power amplifiers", IEEE Transactions on Microwave Theory and Techniques, vol. 59, No. 6, pp. 1579-1588, Jun. 2011.
Huh et al., "Narrow width inductive power transfer system for online electrical vehicles", IEEE Transactions on Power Electronics, vol. 26, No. 12, pp. 3666-3679, Dec. 2011.
Hui et al., "A New Generation of Universal Contactless Battery Charging Platform for Portable Consumer Electronic Equipment", IEEE 35th Annual Power Electronics Specialists Conference, vol. 1, pp. 638-644, Jun. 2004.
Jow et al., "Design and Optimization of Printed Spiral Coils for Efficient Transcutaneous Inductive Power Transmission", 2007 IEEE Transactions on, Biomedical Circuits and Systems, vol. 1, No. 3, pp. 193-202, Sep. 2007.

(56) References Cited

OTHER PUBLICATIONS

Kaczmarczyk, "High-efficiency class E. EF2 and E/F3 inverters", IEEE Transactions on Industrial Electronics, vol. 53, No. 5, pp. 1584-1593, Oct. 2006.

Kajfez, "Q factor measurements, analog and digital", http://www.ee.olemiss.edu/darko/rfqmeas2b.pdf, 18 pages, 1999.

Kajfez et al., "Uncertainty Analysis of the Transmission-Type Measurement of Q-factor", IEEE Transactions on Microwave Theory and Techniques, vol. 47, No. 3, pp. 367-371, Mar. 1999.

Karalis et al., "Efficient wireless non-radiative mid-range energy transfer", Annals of Physics, vol. 323, No. 1, pp. 34-48, 2008.

Kazimierczuk et al., "Class E DC/DC Converters with an Inductive Impedance Inverter", IEEE Transactions on Power Electronics, vol. 4, No. 1, pp. 124-135, Jan. 1989.

Kee et al., "The Class E/F family of ZVS switching amplifiers", IEEE Transactions on Microwave Theory and Techniques, vol. 51, No. 6, pp. 1677-1690, Jun. 2003.

Kim et al., "Automated frequency tracking system for efficient mid-range magnetic resonance wireless power transfer via magnetic resonance coupling", Microwave and Optical Technology Letters, vol. 54, No. 6, pp. 1423-1426, Jun. 2012.

Kuhn et al., "Measuring and Reporting High Quality Factors of Inductors Using Vector Network Analyzers", 2010 IEEE Transactions on Microwave Theory and Techniques, vol. 58, No. 4, pp. 1046-1055, Apr. 2010.

Kurs et al., "Wireless power transfer via strongly coupled magnetic resonances", Science, vol. 317, No. 5834, pp. 83-86, 2007.

Lee et al., "Development and Validation of Model for 95% Efficiency, 220W Wireless Power Transfer over a 30-cm Air-gap", IEEE Energy Conversion Congress and Exposition (ECCE), pp. 885-892, 2010.

Lee et al., "Surface spiral coil design methodologies for high efficiency, high power, low flux density, large air-gap wireless power transfer systems", Twenty-Eighth Annual IEEE Applied Power Electronics Conference and Exposition (APEC), pp. 1783-1790, 2013.

Low et al., "Design and Test of a High-Power High-Efficiency Loosely Coupled Planar Wireless Power Transfer System", IEEE Transactions on Industrial Electronics, vol. 56, No. 5, pp. 1801-1812, May 2009.

Mediano et al., "Class-E RF power amplifier with a flat-top transistor-voltage waveform", IEEE MTT-S International Microwave Symposium Digest (MTT), pp. 1-3, 2012.

Mitcheson et al., "Tuning the Resonant Frequency and Damping of an electromagnetic energy harvester using power electronics", IEEE Transactions on Circuits and Systems II: Express Briefs, vol. 58, No. 12, pp. 792-796, Dec. 2011.

Paing et al. "Resistor Emulation Approach to Low-Power Energy Harvesting", 37th IEEE Power Electronics Specialists Conference, (PESC '06), pp. 1-7, 2006.

Pinuela et al. "Maximising the link efficiency of resonant inductive coupling for wireless power transfer", 1st International Workshop on Wireless Energy Transport and Harvesting, Eindhoven, The Netherlands, 4 pages, Jun. 2011.

Pinuela et al. "Current State of Research at Imperial College London in RF Harvesting and Inductive Power Transfer", Conference paper published on Mar. 12, 2012, 2nd International Workshop on Wireless Energy Transport and Harvesting, 24 pages, 2012.

Pinuela et al., "Maximising DC to load efficiency for inductive power transfer", IEEE Transactions on Power Electronics, vol. 28, No. 5, pp. 2437-2447, 2012.

Rabb, "Idealized Operation of the Class E Tuned Power Amplifier", IEEE Transactions on Circuits and Systems, vol. 24, No. 12, pp. 725-735, Dec. 1977.

Ramo et al., "Fields and Waves in Communication Electronics", John Wiley & Sons, Inc. ISBN 978-0471585510, 858 pages, Jul. 1994.

Rea et al., "Thermal Radiation from Finned Heat Sinks", IEEE Transactions on Parts, Hybrids, and Packaging, vol. PHP-12, No. 2, pp. 115-117, Jun. 1976.

Rivas et al., "A High-Frequency Resonant Inverter Topology With Low-Voltage Stress", IEEE Transactions on Power Electronics, vol. 23, No. 4, pp. 1759-1771, 2007.

Sample et al., "Analysis, experimental results, and range adaptation of magnetically coupled resonators for wireless power transfer", IEEE Transactions on Industrial Electronics, vol. 58, No. 2, pp. 544-554, Feb. 2011.

Schneider, "Wireless power at a distance is still far away [Electrons Unplugged]", IEEE Spectrum, vol. 47, No. 5, pp. 34-39, May 2010.

Schuylenbergh et al., "Inductive powering: basic theory and application to biomedical systems", Springer, pp. 56-58, , Jul. 2009.

Sokal, "Class-E RF power amplifiers", QEX Commun. Quart., No. 204, pp. 9-20, Jan./Feb. 2001.

Sokal et al., "Class E—A New Class of High-Efficiency Tuned Single-Ended Switching Power Amplifiers", IEEE Journal of Solid-State Circuits, vol. SC-10, No. 3, pp. 168-176, Jun. 1975.

Terman, "Radio Engineer's Handbook", McGraw-Hill Book Company, Inc., 1036 pages, 1943.

Vandevoorde et al., "Wireless energy transfer for stand-alone systems: a comparison between low and high power applicability", Sensors and Actuators A: Physical, vol. 92, Issues 1-3, pp. 305-311, Aug. 2001.

Vania, "PRF-1150 1KW 13.56 MHz Class E RF Generator Evaluation Module", Directed Energy, Inc., Technical Note, Doc. #9200-0255, Rev. 1, 20 pages, 2002.

Villa et al., High misalignment tolerant compensation topology for ICPT systems, IEEE Transactions on Industrial Electronics, vol. 59, No. 2, pp. 945-951, Feb. 2012.

Visser, "Aspects of Far-Field RF energy transport", Proceedings of the $42^{nd}$ European Microwave Conference (EuMC), pp. 317-320, Oct. 29-Nov. 1, 2012.

Wang et al., "Experiments on Wireless Power Transfer with Metamaterials", Applied Physics Letters, vol. 98, No. 25, 5 pages, Jun. 2011.

Yates et al., "Optimal transmission frequency for ultralow-power short-range radio links", IEEE Transactions on Circuits and Systems—I: Regular Papers, vol. 51, No. 7, pp. 1405-1413, Jul. 2004.

Zulinski et al., "Idealized Operation of Class E Frequency Multipliers", IEEE Transactions on Circuits and Systems, vol. CAS-33, No. 12, Dec. 1986.

Zulinski et al. "Class E Power Amplifiers and Frequency Multipliers with Finite DC-Feed Inductance", IEEE Transactions on Circuits and Systems, vol. CAS-34, No. 9, pp. 1074-1087, Sep. 1987.

UK Intellectual Property Office, Search and Examination Report for UK Application No.—GB 1215152.8, dated Dec. 6, 2012, 5 pages.

International Searching Authority, International Search Report—International Application No. PCT/GB2013/051456, dated Nov. 20, 2013, 3 pages.

UK Intellectual Property Office, Search and Examination Report for UK Application No.—GB 1309691.2, dated Dec. 3, 2013, 11 pages.

UK Intellectual Property Office, Search Report for UK Application No.—GB 1321267.5, dated Jun. 13, 2014, 5 pages.

International Searching Authority, International Search Report—International Search Report—International Application No. PCT/GB2014/051656, dated Sep. 16, 2014, 8 pages.

International Searching Authority, International Preliminary Report on Patentability for PCT/GB2013/051456, dated Mar. 5, 2015, 7 pages.

IMPI (Mexican Institute of Industrial Property), Examination Report for Mexican Application No. MX/a/2013/006253, dated Apr. 23, 2015, 2 pages.

IMPI (Mexican Institute of Industrial Property), Examination Report for Mexican Application No. MX/a/2013/006253, dated Apr. 23, 2015, 2 pages (English translation).

IMPI (Mexican Institute of Industrial Property), Examination Report for Mexican application MX/a/2013/006253, dated Jul. 3, 2015, 3 pages.

IMPI (Mexican Institute of Industrial Property) Examination Report for Mexican application MX/a/2013/006253, dated Jul. 3, 2015, 3 pages (English translation).

Garnica et al., "Wireless Power Transmission: From Far Field to Near Field", Proceedings of the IEEE, vol. 101, No. 6, pp. 1321-1331, Jun. 2013.

(56) References Cited

OTHER PUBLICATIONS

HaloIPT, "Wireless Charging for Electric Vehicles", http://www.haloipt.com/#nhome-intra, 1 page, Feb. 2012.
Lawson et al. "Long range inductive power transfer system", Journal of Physics: Conference Series, vol. 476, 6 pages, 2013.
Plugless Power, "Plugless Power™, Unleash your EV", www.pluglesspower.com, 4 pages, Feb. 2012.
Strassner et al. "Microwave Power Transmission: Historical Milestones and System Components", Proceedings of the IEEE, vol. 101, No. 6, pp. 1379-1396, Jun. 2013.
WiTricity Corp., "WiTricity Corp. Home—Wireless Electricity Delivered Over Distance", www.witricity.com, 1 page, Feb. 2012.
Japanese Patent Office, Office Action—Notice of Reasons for Rejection pertaining to Japanese Application No. 2015-527959, dated Apr. 25, 2017, 6 pages.
Japanese Patent Office, Office Action—Notice of Reasons for Rejection pertaining to Japanese Application No. 2015-527959, dated Apr. 25, 2017, 5 pages (English Translation).
United States Patent and Trademark Office, Office Action dated Jun. 19, 2017 pertaining to U.S. Appl. No. 14/952,097, 10 pages.

INDUCTIVE POWER TRANSFER SYSTEM

This invention relates to an inductive power transfer system. In general terms this application relates to maximising DC to load efficiency for inductive power transfer.

BACKGROUND

Inductive power transfer (IPT) without a magnetic core was first proposed by Nikola Tesla to supply wireless mains power over long distances around 100 years ago [1]. Since then, low-power, closely-coupled wireless charging methods have been used to power medical implants [2], while the wireless powering of portable devices through charging mats is now available via commercial products [3]. Nonetheless, there has been recent interest in wireless power transfer (WPT) for medium range (i.e. 10 s of cm) applications, such as electric vehicle charging through resonant inductive coupling [4]-[7].

For many industrial and commercial applications, IPT systems must be capable of achieving a high end-to-end efficiency $\eta_{ee}$, while transferring hundreds of watts at sub-meter distances, otherwise they will not be adopted. Several approaches for achieving good link efficiencies have been developed by several research groups. The first is to work at relatively low frequencies (tens of kHz), where efficient driver circuits can be easily realised and by increasing the coupling factor k of the system, using field-shaping techniques; for example, by employing metamaterials [8] and ferrite cores [6]. In [6], 2 kW of power was transferred at a distance of 10 cm using Litz wire coils at 20 kHz. The operating frequency was defined by the power handling capabilities of the coil driver, limiting the maximum coil unloaded Q-factor to 290. Field-shaping techniques normally occupy useful volume, require heavy materials, employ expensive fabrication techniques and need a precise coil alignment. These solutions make the field-shaping approach unsuitable for many applications, where the size, weight and cost of the system are limiting factors.

The second approach relies on transferring energy at the optimum frequency for maximum power transfer given a particular coil size, where the unloaded Q is maximised and compensates for the low coupling factor. In the past, this approach was not considered efficient, since low driver efficiency (due to semiconductor losses) dramatically reduced the end-to-end efficiency of the IPT system. An example of this was described by Kurs et al. [9], where the use of a 9.9 MHz Colpitts oscillator driver achieved an end-to-end efficiency of only 15%, when the transfer efficiency was 50%.

Other attempts at this approach have been successful, with the use of commercially-off-the-shelf (COTS) equipment to drive and impedance match the TX coils at frequencies above 3 MHz and with $\eta_{transfer}=95\%$, while also reducing the coil losses by using a surface spiral [10].

The highest $\eta_{ee}$ have been demonstrated by the commercial IPT systems currently available on the market. High efficiencies of $\eta_{ee}=90\%$ have been achieved at distances of less than 30 cm but with relatively heavy systems (30-40 kg) that use field shaping ferromagnetic materials. In contrast, a system with frequency tracking and no ferromagnetic materials was used in [11], where an estimated $\eta_{dc-load}=70\%$ was calculated. Here, no clear description of the driver's efficiency is given, as it is based on a COTS 50Ω system with added TX and RX loops. Emphasis was again given to the control of the link and transfer efficiency, rather than the dc-to-load efficiency. Other interesting attempts to increase the end-to-end efficiency have been presented in [12], [13], where $\eta_{ee}>60\%$ have been achieved at close proximity.

The present invention, at least in the presently preferred embodiments, seeks to provide a high frequency, cost effective and efficient solution for mid-range IPT in the absence of field-shaping techniques, allowing a light-weight system to be achieved. A system with a TX-RX coil size difference represents a more realistic system, where the receiver size is usually constrained by its application. This system should be able to achieve high efficiency for lower coupling factors, due to the smaller RX coil size. Furthermore, this system should be able to achieve high efficiencies even under situations where perfect alignment is not always achievable (e.g. electric vehicle or wireless sensor charging).

BRIEF SUMMARY OF THE DISCLOSURE

In accordance with the present invention there is provided an inductive power transfer system comprising a transmitter coil and a receiver coil spaced from the transmitter coil, a transmitter circuit comprising the transmitter coil and a receiver circuit comprising the receiver coil. The transmitter circuit is in the form of a Class E amplifier comprising a first inductor and a transistor in series between the terminals of a power supply. The transistor is arranged to switch at a first frequency. The transmitter circuit further comprises a first transmitter capacitor in parallel with the transistor between the first inductor and a power supply terminal, a primary tank circuit in parallel with the first transmitter capacitor, the primary tank circuit comprising the transmitter coil and a second transmitter capacitor arranged in parallel or series with the transmitter coil, and a third transmitter capacitor in series with the first inductor between the first transmitter capacitor and the primary tank circuit. In the presently preferred embodiment, the capacitance of the second transmitter capacitor is selected, such that the resonant frequency of the primary tank circuit is greater than the first frequency. In this way, the primary tank circuit operates in semi-resonance so that the primary tank circuit retains some inductive impedance. The ratio of the first frequency to the resonant frequency of the primary tank circuit is typically in the range 0.5 to 0.9, preferably 0.7 to 0.9. The capacitance of the second transmitter capacitor may be selected, such that the resonant frequency of the primary tank circuit is less than the first frequency. For example, the ratio of the first frequency to the resonant frequency of the primary tank circuit may be in the range 1.1 to 1.5 In embodiments of the invention, the ratio of the first frequency to the resonant frequency of the primary tank circuit is in the range 0.5 to 1.5.

In a preferred arrangement, the receiver circuit has a resonant frequency and the transmitter circuit is configured to vary the first frequency, in order to achieve a desired impedance of the primary tank circuit.

Advantageously, the transmitter coil and/or the receiver coil has an air core. This provides a lightweight design. In embodiments of the invention the transmitter coil and/or the receiver coil has a diameter of at least 5 cm, preferably at least 10 cm. In embodiments of the invention the spacing between the transmitter coil and the receiver coil, in use, is at least 15 cm.

The transistor is typically a MOSFET. The first frequency may be at least 80 kHz, preferably at least 1 MHz. The power transferred between the transmitter coil and the receiver coil may be at least 1 watt, preferably at least 10 watts.

In one arrangement, the receiver circuit comprises a Class E rectifier. The receiver circuit may comprise a first receiver capacitor arranged in parallel with a load, in use, and a secondary tank circuit in parallel with the first receiver capacitor. The secondary tank circuit may comprise the receiver coil and a second receiver capacitor arranged in parallel or series with the receiver coil. A first diode may be provided between the secondary tank circuit and the first receiver capacitor. The capacitance of the second receiver capacitor may be selected such that the resonant frequency of the secondary tank circuit differs from the first frequency, whereby the secondary tank circuit operates in semi-resonance and maintains some reactive impedance. In this way, the necessary reactance for the Class E operation of the rectifier may be provided by the receiver coil alone. The ratio of the first frequency to the resonant frequency of the secondary tank circuit is typically in the range 0.2 to 3. For example, the ratio of the first frequency to the resonant frequency of the secondary tank circuit may be in the range 0.2 to 0.9 or 1.1 to 3. The only inductor in the receiver circuit may be the receiver coil.

The receiver circuit may comprise at least a second diode in parallel with the first diode. In this way, the junction capacitance of the diodes may provide the necessary capacitance for Class E operation without the limitation of the operating voltage of additional capacitors. Thus, the only capacitance in parallel with the diode(s) may be provided by the junction capacitance of the diode(s). The diode(s) may be silicon carbide diodes, gallium nitride diodes or other wide band gap material.

The invention extends to the receiver circuit of the inductive power transfer system. The invention extends to the transmitter circuit of the inductive power transfer system.

BRIEF DESCRIPTION OF THE DRAWINGS

Embodiments of the invention are further described hereinafter with reference to the accompanying drawings, in which.

DETAILED DESCRIPTION

Inductive Power Transfer (IPT) systems for transmitting tens to hundreds of watts have been reported for almost a decade. Most of the work has concentrated on the optimization of the link efficiency and has not taken into account the efficiency of the driver. Class-E amplifiers have been identified as ideal drivers for IPT applications, but their power handling capability at tens of MHz has been a crucial limiting factor, since the load and inductor characteristics are set by the requirements of the resonant inductive system. The frequency limitation of the driver restricts the unloaded Q factor of the coils and thus the link efficiency. With a suitable driver, copper coil unloaded Q factors of over 1,000 can be achieved in the low MHz region, enabling a cost-effective high Q coil assembly. The system described herein alleviates the use of heavy and expensive field-shaping techniques by presenting an efficient IPT system capable of transmitting energy with a dc-to-load efficiency above 77% at 6 MHz across a distance of 30 cm. This is believed to be the highest dc-to-load efficiency achieved for an IPT system without introducing restrictive coupling factor enhancement techniques.

Figure 1:
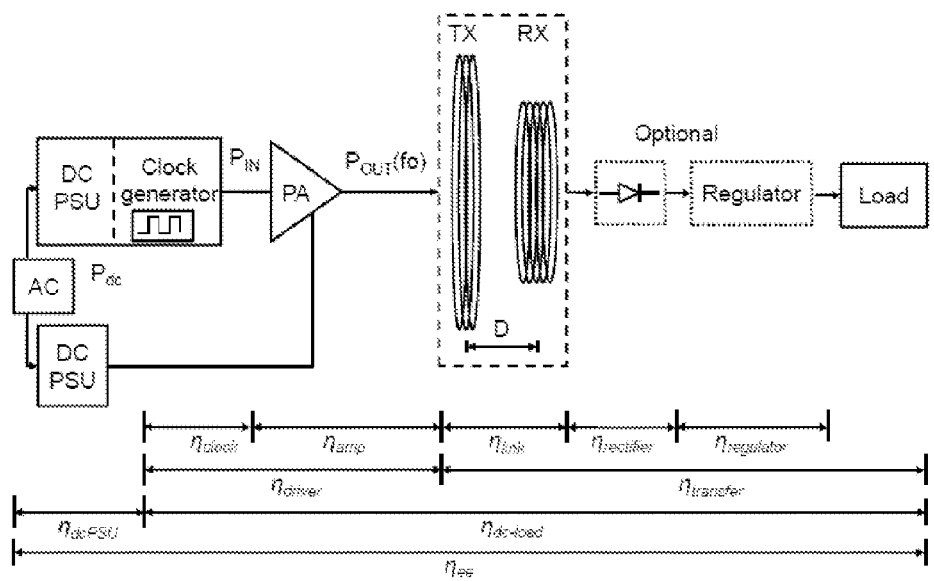
FIG. 1 shows an inductive power transfer system architecture.

A basic IPT system architecture comprises several modules, as illustrated in FIG. 1. The architecture includes DC power supply units (PSUs), coil driver (i.e. clock generator and power amplifier (PA) having an impedance matching network), transmitting (TX) coil with separation distance D from a receiving (RX) coil (measured from the centre-to-centre of the coils), an optional rectifier/regulator and a load. To fully characterize the complete system, the end-to end efficiency $\eta_{ee}$ of all the building blocks, from the AC source to the load, can be considered as $\eta_{ee} = \eta_{dc-PSU} \eta_{dc-load}$, where the efficiency terms are shown in FIG. 1. In FIG. 1, $\eta_{dc\text{-}load} = \eta_{driver} \eta_{transfer}$, $\eta_{driver} = \eta_{clock} \eta_{amp}$, $\eta_{dc\text{-}PSU}$ is the combined efficiency of the dc power supplies, $\eta_{dc\text{-}load}$ is the dc-to-load efficiency, $\eta_{driver}$ is the efficiency of the driver, $\eta_{link}$ is the link efficiency, $\eta_{transfer}$ is the transfer efficiency, $\eta_{clock}$ is the efficiency of the driver clock, $\eta_{amp}$ is the efficiency of the power amplifier, $\eta_{rectifier}$ is the rectifier efficiency and $\eta_{regulator}$ the efficiency of the regulator. The present invention focuses on optimizing $\eta_{dc\text{-}load}$ for an IPT system without a rectifier or regulator, i.e. maximising: $\eta_{dc\text{-}load} = P_{load}/P_{dc}$ where $P_{dc}$ is the total DC input power to the system (i.e. into the clock and power amplifier) and $P_{load}$ is the real power dissipated in the load.

It is important that consistent, well-defined figures of merit, such as $\eta_{dc\text{-}load}$ and $\eta_{ee}$, are used to evaluate IPT systems to allow a straightforward comparison of the different emerging technologies in this field. From the IPT systems architecture in FIG. 1, the transfer efficiency just describes part of the system's efficiency and does not take into account the driver.

The table below shows comparisons of the state of the art in IPT systems. In the table $\eta_{transfer}$, $\eta_{dc\text{-}load}$ and $\eta_{ee}$ have been separated out, where possible, to highlight that dc-to-load efficiency can be substantially lower than the transfer efficiency.

$$\eta_{link} = \frac{k^2 Q_{TX} Q_{RX}}{\left(1 + \sqrt{1 + k^2 Q_{TX} Q_{RX}}\right)^2}$$

As can be seen from the above formula, the key to achieving high efficiency is to maximise $k^2 Q_{TX} Q_{RX}$. The coil Q factor can be maximized by choosing the correct operating frequency [27]. Analysis on the interactions of these key variables, using both closed form mathematical expressions and more detailed numerical modelling in Matlab, has yielded the following underlying principles for optimisation [28]:

The loop radii should be maximized, in order to maximize the coupling factor;

For a given constraint on loop dimensions, there is an optimal frequency, which is approximately the point at which the radiation resistance begins to be significant compared to the skin-effect resistance;

The wire radius and the number of coil turns should be as large as possible (bearing in mind that the coils should remain electrically small, to limit the electric field and hence radiation); and

| D [cm] | fo [kHz] | Driver Technology | Coil Technology | Magnetic Material | $P_{load}$ [W] | $\eta_{transfer}$ [%] | $\eta_{dc\text{-}load}$ [%] | $\eta_{ee}$ [%] | Ref. |
|---|---|---|---|---|---|---|---|---|---|
| 0 | 134 | Class-E | Litz wire | No | 295 | — | — | 75.7 | [12] |
| 0 | 240 | Class-E | Litz wire | No | 3.7 | 71 | — | 66 | [13] |
| 10 | 20 | H-bridge | Litz wire | Yes | 2,000 | 85 | — | — | [6] |
| 10 | — | — | — | Yes | 3,300 | — | — | 90 | [14] |
| 15 | 6,700 | HP transceiver | Loop + pancake coil | No | — | 93 | — | — | [15] |
| 15 | — | H-bridge | Litz wire | Yes | 2,000 | 95 | — | — | [16] |
| 18 | 145 | — | Litz wire | Yes | 300-3,000 | — | — | 90 | [17]-[19] |
| 20 | 4,000 | Class-E | Copper wire coil | No | 2 | — | 50 | — | [20] |
| 20 | 20 | H-bridge | Power lines | Yes | 60,000 | 80 | — | — | [21] |
| 20 | 20 | H-bridge | Power rail | Yes | 27,000 | — | — | 74 | [22] |
| 30 | 3,700 | HF transceiver | Surface spiral | No | 220 | 95 | — | — | [10] |
| 30 | 6,000 | Class-E | Copper pipe coils | No | 95 | — | 77 | — | [our work] |
| 18-30, 40** | 20 | H-bridge | — | Yes | 3,000 | — | — | >85 | [23], [24] |
| 70 | 7,650 | Signal generator | Loop + pancake coil | No | 30 | 75 | — | — | [25] |
| 50 | 13,560 | Class-E | Loop + rectangle coil | No | 70 | 85 | 70*** | — | [11] |
| 50 | 27,000 | HF transceiver | Loop + spiral coil | No | 40 | 47 | — | — | [8] |
| 100 | 508.5 | Class-D | Litz wire | No | 5-35 | 76 | — | — | [26] |
| 200 | 9,900 | Colpitts oscillator | Litz wire | No | 60 | 50 | — | 15 | [9] |

*Maximum power transfer distance stated in the cited website [24]
**Calculated based on estimated value of $\eta_{driver}$ [11]

In the following there is provided an overview of IPT theory, outlining systems architecture and key component selection that define the system's end-to-end and dc-to-load efficiencies. Cost efficient coil design, simulations and measurements to achieve dc-to-load efficiencies above 70% for sub-meter distances are described. A framework for driver modelling, component selection and layout considerations to achieve a low loss, high frequency DC-RF conversion, capable of delivering more than 100 W at a distance of 30 cm is described. A full system characterization under different misalignment scenarios is also described.

With the typical IPT system architecture shown in FIG. 1, the driver provides high frequency power to the TX coil, having an unloaded quality factor $Q_{TX}$, which couples as defined by the coupling factor (or coefficient) k to the RX coil, having an unloaded quality factor $Q_{RX}$. It is known that by using receiver (or secondary) resonance and optimising the load impedance, the link efficiency can be maximized to give:

In the case where the loops are not of equal size, the maximum operating frequency will be mainly determined by the larger of the two coils, also this dictates the lowest self-resonance frequency.

As presented in [12], four different configurations have been widely used for IPT systems. A series resonance can only be used if the parasitic shunt capacitance of the inductor is assumed to be negligible. In contrast, this assumption is not needed for the parallel case, since the parallel resonator capacitor can absorb the parasitic capacitance of the coil.

Furthermore, the coupled RX coil is always assumed to be operating at resonance; this way the equivalent optimal load on the transmitter, reflected from the receiver, will only be resistive, affecting only the damping of the transmitter tank [2].

To increase the efficiency of an IPT system, capable of transmitting tens to hundreds of watts at a distance of 30 cm, with perfectly aligned coils, simulations as described in [28] and measurements as described in [29], were undertaken for the TX and RX coils. With this technique, the Q-factor was measured through transmission coefficient measurements using two loosely inductive coupled coils as probes. For electromagnetic design reasons, the distance D from the centre-to-centre of the coils is used. However, it is important to note that the minimum distance between coils is (D-7) cm in these results. As mentioned previously, a different sized TX and RX coil was used in the setup; this was thought to be more realistic for most scenarios. The coils were fabricated with copper piping having a 1 cm diameter and 1 mm wall thickness.

After characterizing the coils, the highest Q for both TX and RX coils is found close to 6 MHz, where skin depth is only 27 μm. The maximum unloaded Q value for the 5-turn, 20 cm diameter RX coil was $Q_{RX}=1,100$ and $Q_{TX}=1,270$ for the 3-turn, 30 cm TX coil; these matched simulation results when using the following standard expression for the unloaded Q-factor of a coil:

$$Q = \frac{\omega_d L}{R_{rad}(\omega_d) + R_{Skin}(\omega_d)}$$

where $$R_{rad}(\omega_d) = N^2 \eta_o \left(\frac{\pi}{6}\right)(\beta_o(\omega_d)r)^4$$

$$R_{Skin}(\omega_d) \approx \frac{Nr}{2a}\sqrt{\frac{\omega_d \mu_o}{2\sigma_o}}$$

where $\omega_d$ is the driven angular frequency of operation, L is the self inductance of the coil, $R_{rad}(\omega_d)$ is the radiation resistance [30], N is the number of turns of the coil, $\eta_o$ is the impedance of free space, r is the radius of the coil, $\beta_o(\omega_d)=2\pi/\lambda_d$, $\lambda_d$ is the free space wavelength at the driving clock frequency, a is radius of the copper pipe, $\sigma_o$ is the low frequency conductivity of copper and $\mu_o$ is the permeability of free space. $R_{Skin}(\omega_d)$ is an approximation of the skin-effect resistance but was calculated in simulations using Butterworth's numerical model [31], which also takes into account proximity effects.

A re-configurable test fixture was fabricated to hold the coils and allow for reproducible and easily adjustable operating scenarios, as will be described below. Perspex was used for both the stands and the coil spacers, to avoid the generation of eddy currents that could result in measurement errors. The coil spacers helped to maintain a fixed distance of 2 cm between windings, measured from the centres of the pipe, to reduce the proximity effect between turns. The test fixture allows the variation of D, transverse offset and angular misalignment between both coils.

Figure 2:
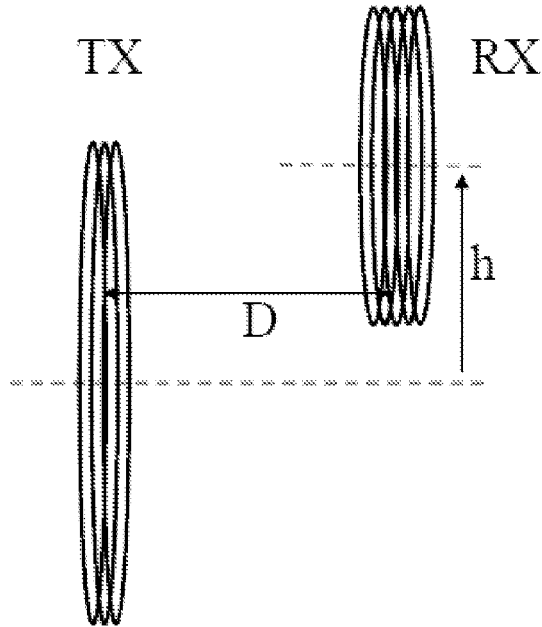
FIG. 2 shows an experimental set-up for distance and transverse offset measurements.
Figure 3:
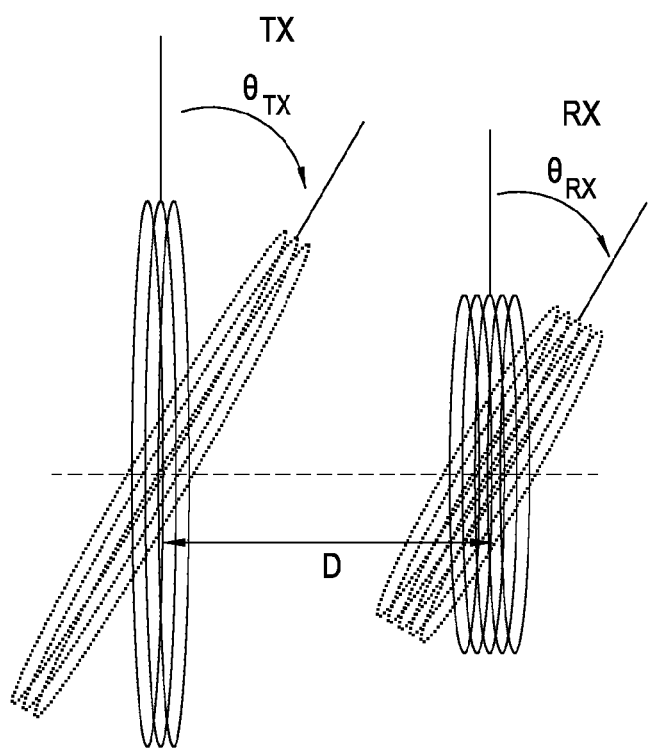
FIG. 3 shows an experimental set-up for angular misalignment measurements.

Coupling factor measurements were undertaken to characterize the coil coupling in an array of different scenarios. Measurements were undertaken with different separation distances or against transverse coil offsets h, as illustrated in FIG. 2; or transmitter or receiver coil angular misalignment, $\theta_{TX}$ or $\theta_{RX}$, respectively, as illustrated in FIG. 3. For experiments involving transverse offset or angular misalignment, the centre-to-centre distance was fixed at D=30 cm, (the minimum distance between coils is 23 cm). Data from these measurements was also used to predict the operating characteristics, as well as the expected efficiency of the IPT system. The k measurements and calculations were performed with a well-known voltage transfer technique, as described in detail in [2].

Figure 4:
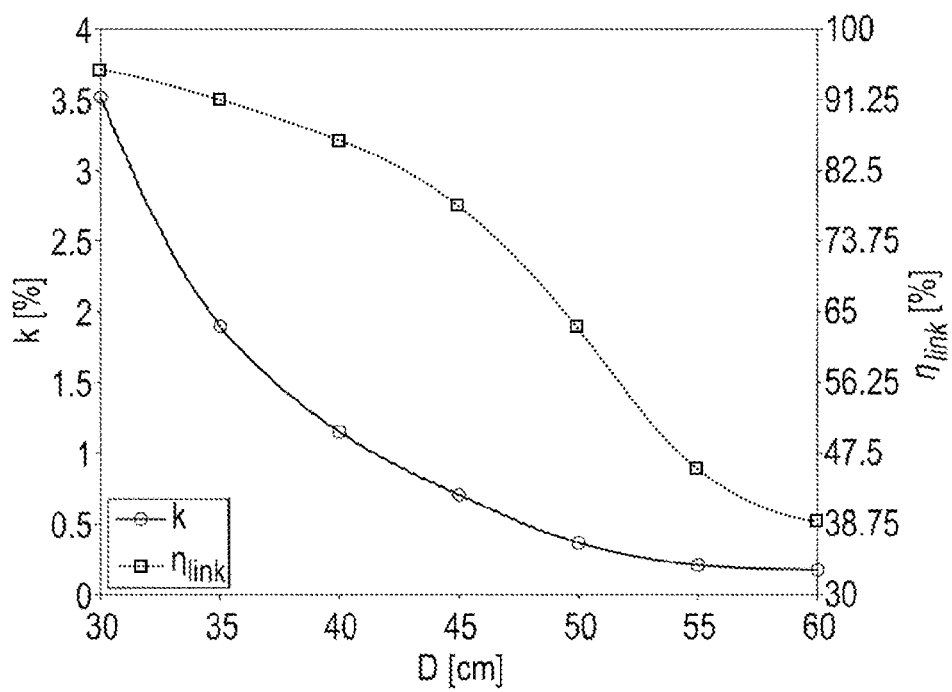
FIG. 4 illustrates measurements of coupling factor against coil separation distance in air, with perfectly aligned coils.
Figure 5:
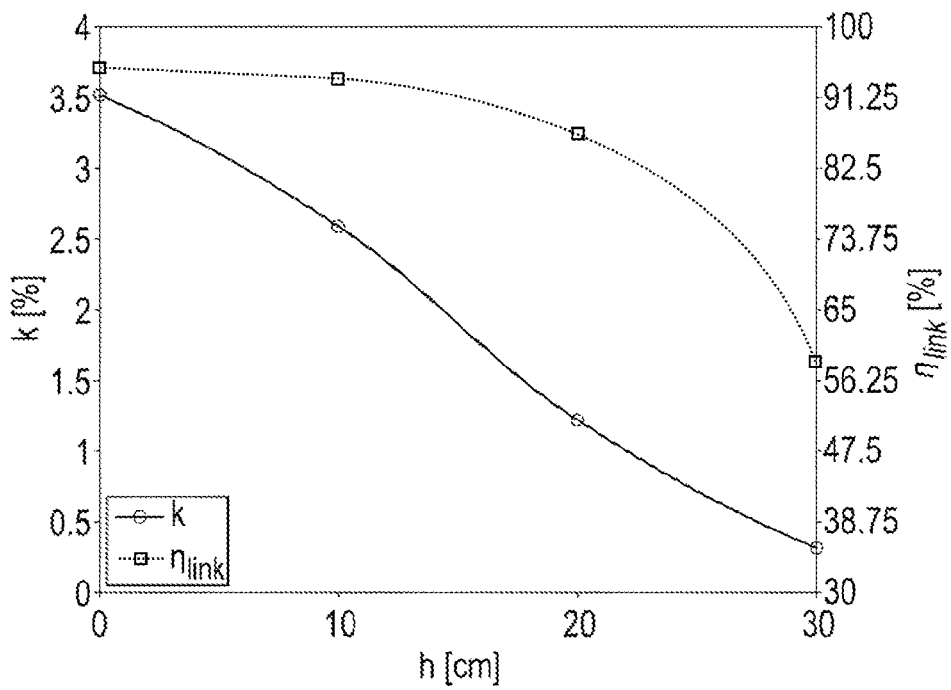
FIG. 5 illustrates measurements of coupling factor against coil transverse offset in air, at a distance of 30 cm.

FIGS. 4 and 5 show the coupling factor and link efficiency for different distance and transverse offset measurements.

Configurations which give rise to the same coupling coefficient are expected to achieve the same efficiency, i.e. perfectly aligned at a separation of D=40 cm should achieve the same efficiency as an offset of h=21 cm at D=30 cm.

Figure 6:
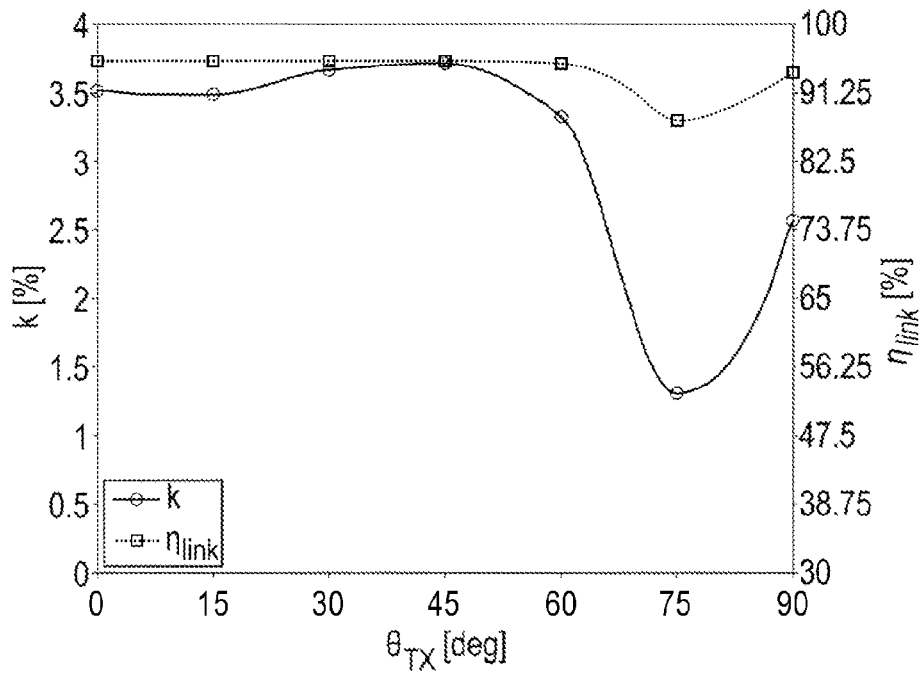
FIG. 6 illustrates measurements of coupling factor against transmitter coil angular misalignment, at a distance of 30 cm.
Figure 7:
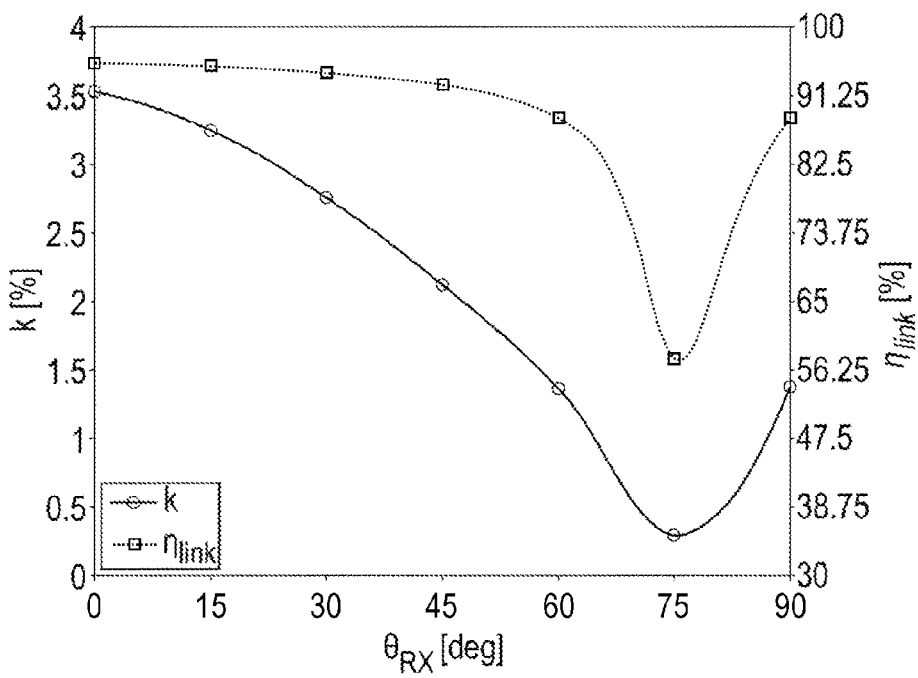
FIG. 7 illustrates measurements of coupling factor against receiver coil angular misalignment, at a distance of 30 cm.

FIGS. 6 and 7 show k measurement results for TX and RX angular misalignment, respectively. In FIG. 6, while the TX coil angle increases, the distance between both coils reduces enough to compensate for angular misalignment. With the RX coil angle variation, a trough is seen at $\theta_{RX}=75$ degrees, since this is the point at which the distance between the coils is not enough to compensate for the angular misalignment. These conclusions are based on a clear correlation between the coupling factor measurements and dc-to-load efficiency.

Based on the above coupling factor analysis and measurements of the coils to be used in the later experiments, a high frequency, high power driver is required. In a typical IPT system, this is achieved by driving the coils with a 50Ω loop that is impedance matched to a high frequency COTS RF transmitter with an output power amplifier. In this typical RF scenario, the maximum power transfer is achieved but not the desired maximum efficiency. In accordance with the invention, the number of stages can be reduced if the 50Ω impedance is avoided, by integrating the power amplifier and impedance matching circuits into one driver sub-system. This is achieved by carefully designing a high efficiency power amplifier capable of high frequency operation. The Class-E amplifier is an ideal solution, since zero voltage and zero current switching can be achieved with the appropriate choice of components.

Class-E amplifiers have been designed and used extensively since Sokal and Sokal demonstrated the operational characteristics of their zero-switching power amplifier [32]. It is important to note, however, that even though this power amplifier topology is widely known, designing high power amplifiers capable of working at 100 W and switching at a few MHz is not a trivial task. This is mainly due to the high power rating and fast switching capabilities that only a suitable power RF MOSFET can achieve, as well as the need to employ high Q capacitors. Furthermore, since an atypical non-50Ω power amplifier is needed, to avoid additional impedance matching network components and their associated losses, the resonant Class-E topology needs to be modified to suit the coils' characteristics.

Figure 8:
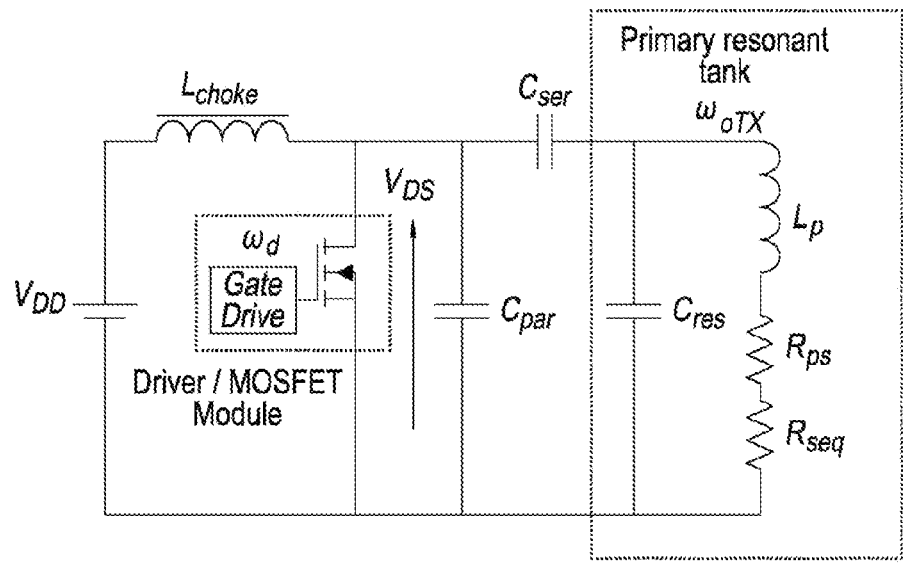
FIG. 8 shows a semi-resonant Class-E topology, with $\omega_d < \omega_{oTX}$ according to an embodiment of the invention.

To achieve a good efficiency, a semi-resonant Class-E topology was selected as a suitable solution [2]. FIG. 8 shows the circuit of a semi-resonant Class-E amplifier for the transmitter resonant tank, where the apparent load (represented by the TX coil series resistance $R_{ps}$ and the effective receiver impedance $R_{seq}$) and the apparent inductor (represented by the primary coil's inductance $L_p$), appear to be larger, thus helping to increase both driver and link efficiencies. This is achieved by tuning the primary resonant tank at a higher resonant frequency $\omega_{oTX}$. This frequency is higher than the receiver's resonant tank driven resonant frequency $\omega_o = f_{oRX}$, at which the MOSFET gate driver switches at an operating frequency $\omega_d$, where $\omega_{oTX} > \omega_{oRX} \equiv \omega_d$. This semi-resonant operation also avoids the losses associated with an extra inductor, typically added in series with the TX coil to increase the driver efficiency [12]. Furthermore, as will be demonstrated below, the use of semi-resonant operation allows a simple but effective tuning mechanism; by modifying the frequency ratio $\omega_d/\omega_{oTX}$, the effective equivalent resistance and inductance of the primary tank can change for different operating scenarios.

Thus, in accordance with an embodiment of the invention, the inductive power transfer system illustrated in FIG. 8 comprises an air core transmitter coil TX (the inductance of the transmitter coil TX is represented by the inductor $L_p$ and the resistance of the transmitter coil is represented by the resistor $R_{ps}$) and an air core receiver coil RX (the resistor $R_{seq}$ represents the resistive effect of the receiver coil RX on the primary resonant tank circuit) spaced from the transmitter coil. The transmitter coil and/or the receiver coil has a diameter of at least 10 cm. In the illustrated embodiment the diameter of the transmitter coil is 30 cm and the diameter of the receiver coil is 20 cm. The spacing between the transmitter coil and the receiver coil, in use, is at least 15 cm. In the examples herein the spacing D between the transmitter coil and the receiver coil ranges between 30 cm and 60 cm.

The system further comprises a transmitter circuit comprising the transmitter coil and a receiver circuit comprising the receiver coil. The transmitter circuit is in the form of a Class E amplifier comprising a first inductor $L_{choke}$ and a transistor (MOSFET) in series between the terminals of a power supply $V_{DD}$. The transistor is arranged to switch at a first frequency $\omega_d$ by means of a gate drive. A first capacitor $C_{par}$ is arranged in parallel with the transistor between the first inductor $L_{choke}$ and a power supply terminal. A primary resonant tank circuit is provided in parallel with the first capacitor $C_{par}$. The tank circuit comprises the transmitter coil and a second capacitor $C_{res}$ arranged in parallel with the transmitter coil. A third capacitor $C_{ser}$ is provided in series with the first inductor $L_{choke}$ between the first capacitor $C_{par}$ and the tank circuit. In FIG. 8, the inductance of the transmitter coil TX is represented by the inductor $L_p$ and the resistance of the transmitter coil is represented by the resistor $R_{ps}$. The resistor $R_{seq}$ in FIG. 8 represents the resistive effect of the receiver coil RX on the primary resonant tank circuit. The receiver circuit comprises a Class E rectifier.

The capacitance of the second capacitor $C_{res}$ is selected, such that the resonant frequency $\omega_{oTX}$ of the tank circuit is greater than the first frequency $\omega_d$. Typically, the ratio of the first frequency $\omega_d$ to the resonant frequency $\omega_{oTX}$ of the tank circuit is within the range 0.7 to 1. The receiver circuit has a resonant frequency $\omega_o$ and the transmitter circuit is configured to vary the first frequency $\omega_d$, in order to achieve a desired impedance of the tank circuit. The first frequency $\omega_d$ is at least 80 kHz, typically at least 1 MHz. The power transferred between the transmitter coil and the receiver coil is at least 10 milliwatts. In an alternative arrangement, the second capacitor $C_{res}$ is arranged in series, rather than parallel, with the transmitter coil TX. In this case, the capacitance of the second capacitor $C_{res}$ is selected, such that the resonant frequency $\omega_{oTX}$ of the tank circuit is less than the first frequency $\omega_d$. Typically, the ratio of the first frequency $\omega_d$ to the resonant frequency $\omega_{oTX}$ of the tank circuit is within the range 1 to 1.5.

Using the results provided above, for an operating scenario with D=30 cm and a perfect coil alignment, PSpice simulations were performed to validate the design equations and design guidelines presented in [2], [33], [34] but modified to account for semi-resonant operation.

Figure 9:
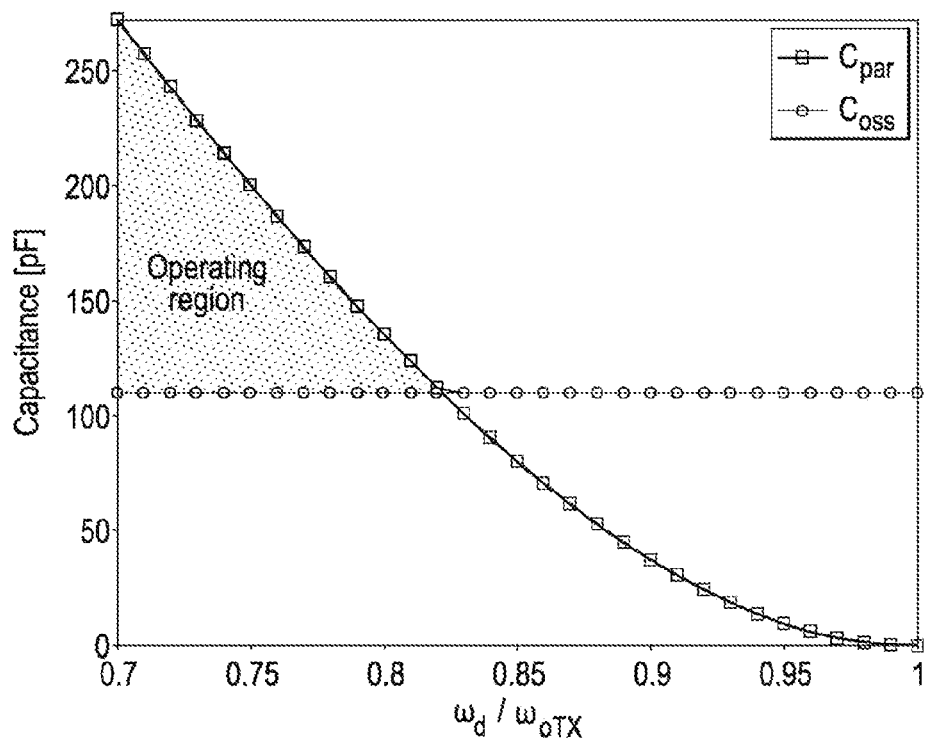
FIG. 9 shows simulated $C_{par}$ values against $\omega_d/\omega_{oTX}$ for Class-E MOSFET selection with a drain-source voltage of 230 V.

The IXYSRF IXZ421DF12N100 module, which includes a DE375-102N12A power MOSFET and integrated gate driver, was selected as the best available MOSFET because of its high power handling and nanosecond switching capabilities. This module was also selected due to its relatively low output capacitance $C_{oss}$ at drain-source voltage $V_{DS}$=230V, required for 100 W operation. It is important to note that $C_{oss}$ is effectively absorbed by $C_{par}$ and thus is a limiting factor for selecting the maximum $\omega_d/\omega_{oTX}$ required for high efficiencies. FIG. 9 shows this dependency, where a maximum $\omega_d/\omega_{oTX}$=0.82, for the set of coils described in the previous section, can be achieved using the selected MOSFET.

Working past this threshold would result in a detuned Class-E amplifier, incapable of achieving zero-voltage, zero-current at the time of switching. At this optimal point, for the same power, $V_{DS}$ will increase and $I_{DS}$ will decrease, resulting in a greater Class-E efficiency.

During simulations, parasitic inductances and capacitances were added to the model as well as the effective series resistance (ESR) of the capacitors to account, as accurately as possible, for all the losses during operation. Variations of less than 5% in the Class-E capacitor values, compared to those used in the PSpice simulation, were required to achieve a zero voltage, zero current crossing and account for the high loaded Q of the resonant circuit due to a low coupling factor.

Figure 10:
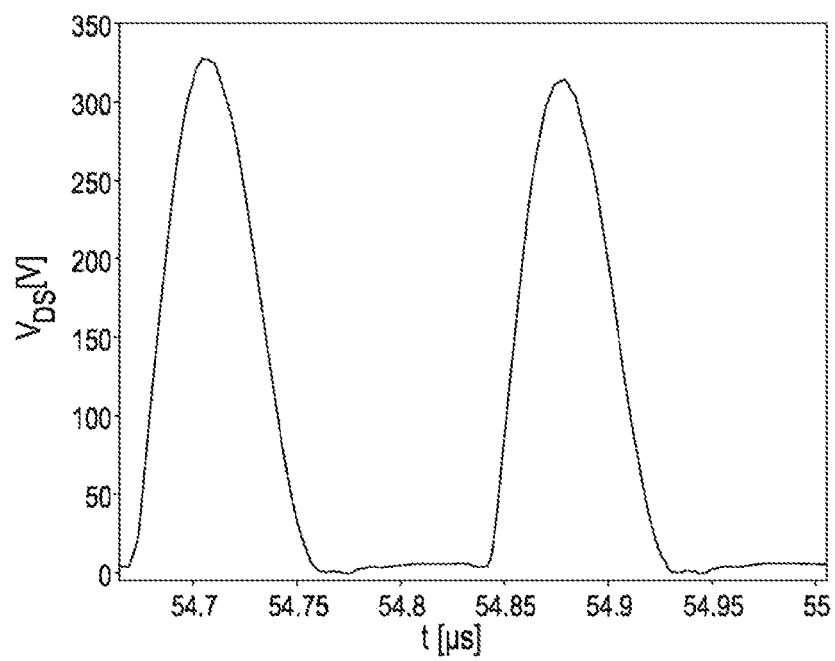
FIG. 10 shows the simulated drain-source voltage (PSpice) against time t for the semi-resonant Class-E driver.

As shown in FIG. 10, a smooth landing of $V_{DS}$ was possible without any negative ringing and an almost ideal Class-E operation was achieved with a simulated dc-to-load efficiency of 80%.

Several key layout considerations had to be taken into account, in order to avoid ground bouncing and ensure good operation. The integrated driver/MOSFET module's input dc bus and gate signal were kept as short as possible; this also applied to ground paths for the module, PSU and load. To achieve this, ground planes were placed around all components in both layers of the standard low-cost FR-4 substrate, leaving arcing clearances around the tracks and components that were located close to the coil, where voltages as high as 1 kV are present during operation. Similarly, as with the tracks between the driver and MOSFET, all grounding tracks were kept as short as possible to decrease their resistance and inductance, but wide enough to avoid track lifting due to overheating.

In addition to layout considerations, component selection was crucial to enable high frequency operation. A combination of Dielectric Laboratories C40AH capacitor values were employed for $C_{par}$, $C_{ser}$ and both resonator capacitors as they have very high Q and low ESR. Finally, the choice of the choke inductor that ensures only dc current from the PSU flows through the MOSFET was particularly challenging to design, due to the high current and high frequency characteristics of the system. A ferrite core was not suitable, due to its poor high frequency performance. For this reason, an iron powder core was selected, due to its low permeability and stability for high power applications, as well as high self-resonance frequency.

Figure 11:
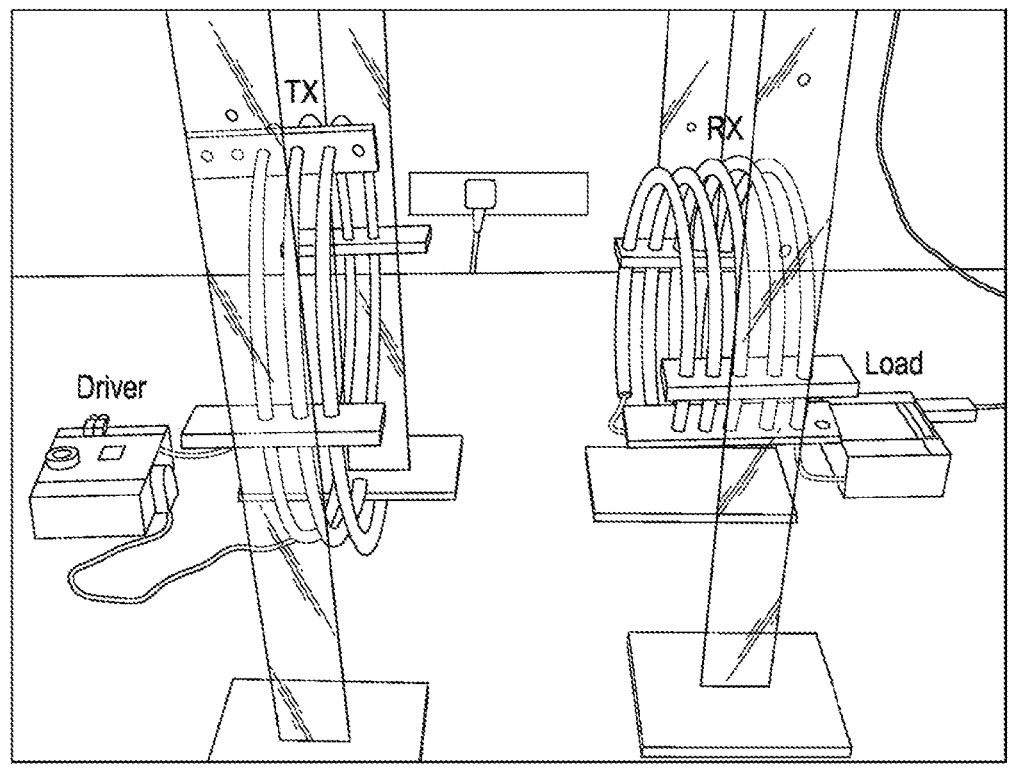
FIG. 11 shows a perfectly aligned IPT test rig with D=30 cm.

To fully characterize the practical IPT demonstrator system, shown in FIG. 11, a thorough experimental analysis was performed. The main goal of these experiments was to investigate its behaviour in different scenarios, by varying distance, transverse offset and angular misalignment; this allows a comparison against perfect alignment, to which the system was initially tuned (based on simulations). Furthermore, the results from these experiments were compared against results from frequency tuning the system for each different scenario.

In all experiments, the input voltage $V_{DD}$ was kept constant at 60V. This allowed sensible values of drain-source voltage to be obtained during operation, to which the output capacitance of the MOSFET is dependent, and helped to avoid replacing $C_{par}$ in each experiment. A constant input DC power for all experiments could not be achieved. This is because, in several scenarios, driver operation was far away from Class-E operation, resulting in high losses during switching that could have degraded or destroyed the MOSFET module.

Due to the fact that the optimal load is very large (e.g. 21 kΩ for the simulated scenario), a non-inductive resistor was used. Special considerations where taken to achieve the desired load with a resistive network, because a non-inductive resistor capable of handling more than 50 W was not commercially available. Metal film resistors where chosen, given their low inductance behaviour at high frequencies and capacity to handle a few watts (enough to withstand up to 100 W, once the load network was made). A major limitation for this type of resistor is that as its resistance and operating frequency increase the parasitic shunt capacitance also increases and as the resistor temperature increases its resistance varies. The parasitic capacitance for these resistors was calculated to be 2.8 pF at 6 MHz. This was taken into account when designing the load network and also the selection of the receiver's tuning capacitor. The total capacitance from the load resistor was absorbed by the calculated tuning capacitance, to ensure receiver resonance, thus avoiding the reflection of capacitive reactance to the transmitter side.

The dc-to-load efficiency of the system was initially measured using Agilent N2783A current probes, but, after several measurements, it was noted that the results were not reflecting the true operation of the circuit. Also, the current probes are not capable of measuring current accurately in the presence of significant electromagnetic noise [35]. The voltage across the load could not be measured with the oscilloscope probe, because the probe's capacitance is 15 pF, enough to detune the receiver coil from resonance. For these reasons, and the fact that the resistor's precise temperature dependence is unknown, an indirect method of measuring the dc-to-load efficiency was implemented. Power was inferred from accurate steady-state heat-sink temperature measurements, since both the driver and the load (including the tuning capacitors) were placed over separated, isolated heat sinks without forced-air cooling. The input DC power was also measured accurately and used together with the RX thermal measurements to calculate the dc-to-load efficiency using the following:

$$\eta_{dc\text{-}load} = \frac{T_{ssRX} - T_{amb}}{R_{thRX}(T)P_{dc}}$$

where $T_{amb}$ is the ambient temperature, $T_{ssRX}$ is the heat sink steady-state temperature of the receiving coils and $R_{thRX}(T)$ is the lumped thermal resistance of the RX load. The temperature measurements were calibrated by applying a known DC power to the RX load until all temperatures reached steady state. Measurements under the same thermal experimental conditions as when the IPT system was tested were performed.

Due to the RX load spatial distribution over the heat sink and the fact that the heat sink was positioned with the fins facing downwards on the bench, with a 333 K temperature gradient $R_{thRX}$=208 K/W compared well to the manufacturer's 203 K/W. Furthermore, by characterizing the load arrangement, the non-linear behaviour of the heat sink was accounted for, which can be as high as 25% to 50% of the dissipated heat, according to [36].

It is important to note that this is a conservative dc-to-load efficiency calculation, since $T_{amb}$ will increase as $T_{ssRX}$ increases; giving a lower $\eta_{dc\text{-}load}$ when compared to the scenario where $T_{amb}$ could be kept constant until the steady state of the system is reached.

Even more important is the fact that as the temperature of the resistors increases the value of the load resistance will start to drift away from its optimal value, drifting away from maximum efficiency.

To achieve a semi-resonant Class-E operation similar to that observed by simulations, an iterative tuning process was performed. This establishes the appropriate values for the driver and the coil capacitors (taking into account their fabrication tolerances) and the coil Q variations (due to metallic objects, such as bench supports, being in close physical proximity to the experiments).

First, the receiver resonator's capacitor had to be decreased, to account for the load resistor's equivalent shunt capacitance for correct receiver resonance. With an untuned receiver, the value of the transmitter resonator's capacitor would need to change, to account for the reflected reactance from the receiver onto the transmitter and ensure that semi-resonance operation is still present. This changes the ratio of $\omega_d/\omega_{oTX}$, which creates the need for retuning $C_{par}$ and $C_{ser}$. The major limitation of this scenario is that if the ratio $\omega_d/\omega_{oTX}$ starts to increase, there is a point at which the required $C_{par}$ needed to tune the driver is lower than $C_{oss}$ of the MOSFET, which makes the MOSFET unsuitable for Class-E operation.

Once receiver resonance is obtained, a similar procedure can be followed to achieve zero switching operation, as described in [33]. Since $C_{par}$ is implemented by an external physical capacitor and $C_{oss}$, which is dependent on $V_{DS}$, extra iterations are needed to achieve good operation. As seen from simulations, $V_{DS}$ is a very useful guide to Class-E operation, therefore tuning the peak-to-peak voltage is as important as achieving zero voltage zero current switching to increase the efficiency [34]. Based on [32], if $V_{DS}$>3.56 $V_{DD}$, $C_{par}$ needs to be increased in steps of 5 pF and if $V_{DS}$<3.56 $V_{DD}$, it should be decreased by the same amount until the correct $V_{DS}$ is achieved. While doing this, $C_{ser}$ may need a slight adjustment to bring back the driver to zero switching.

Figure 12:
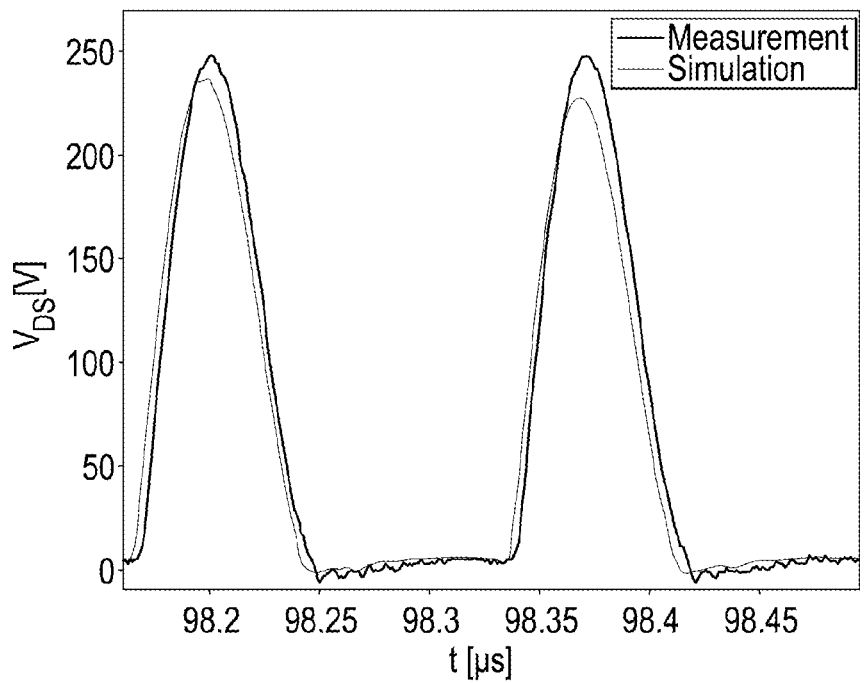
FIG. 12 shows the drain to source voltage against time for the IPT system with a 30 cm separation distance and $P_{dc}$=90 W.

Since the load resistance value varies with temperature, several iterations were performed by increasing or decreasing the load resistance by ±5%, until a maximum efficiency of 66% was achieved. For each iteration, receiver resonance was achieved and tuning of $C_{par}$ and $C_{ser}$ was performed as previously described. FIG. 12 shows the drain-source voltage (simulated and measured) for the tuned IPT system for an aligned set of coils at a separation distance of 30 cm; the input dc power was 90 W.

Whilst the waveform generated from simulations has a smooth landing, a negative ripple of less than 10V can be seen when the MOSFET is ON. This negative ripple is generated by a small voltage still present at the drain, when the MOSFET is turned ON, due to a higher than expected loaded Q for the transmitter resonant circuit. This was the best possible switching achieved with the discrete capacitors available. The higher measured $V_{DS}$ results could be decreased by adding more capacitance to $C_{par}$, but this change was not reflected in a measurable efficiency improvement. Therefore, to decrease the losses in the capacitor (due to ESR), no extra parallel capacitor was added and $V_{DS}$ was left higher than expected in the simulation.

Figure 13:
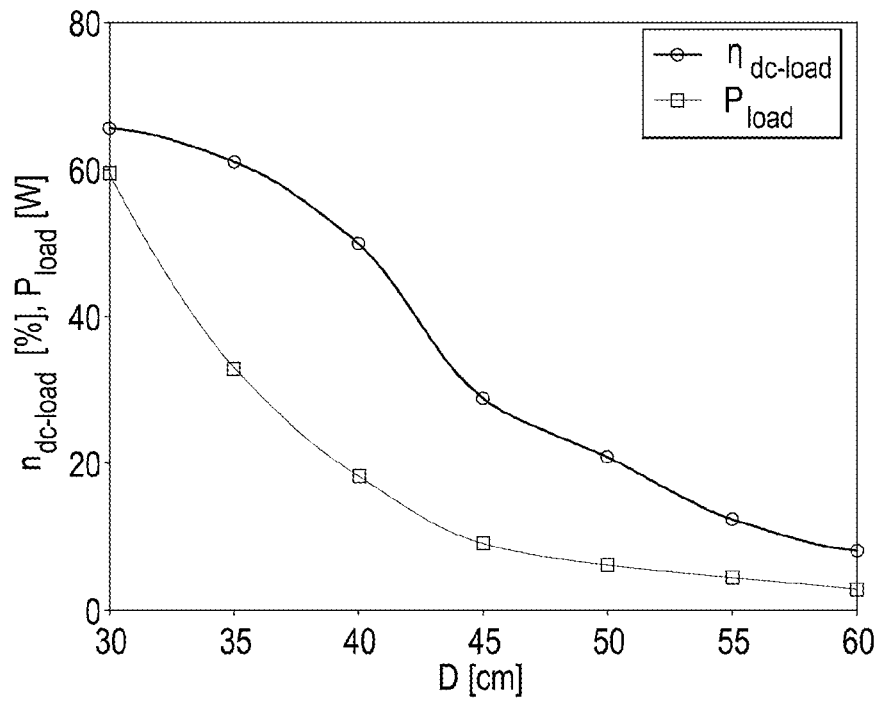
FIG. 13 illustrates measurement of the dc-to-load efficiency against separation distance with fixed clock frequency tuning to aligned 30 cm separation distance scenario.

Once the IPT system was optimally tuned to achieve a high efficiency, while being perfectly aligned, measurements with different separation distances were performed to observe the operating capabilities without performing extra tuning. As can be seen in FIG. 13, the distance between the coils was varied between 30 and 60 cm. As D increases the efficiency decreases as the coupling factor decreases, detuning the driver and creating the need for different $C_{par}$ and $C_{ser}$ values to re-establish zero switching operation.

Figure 14:
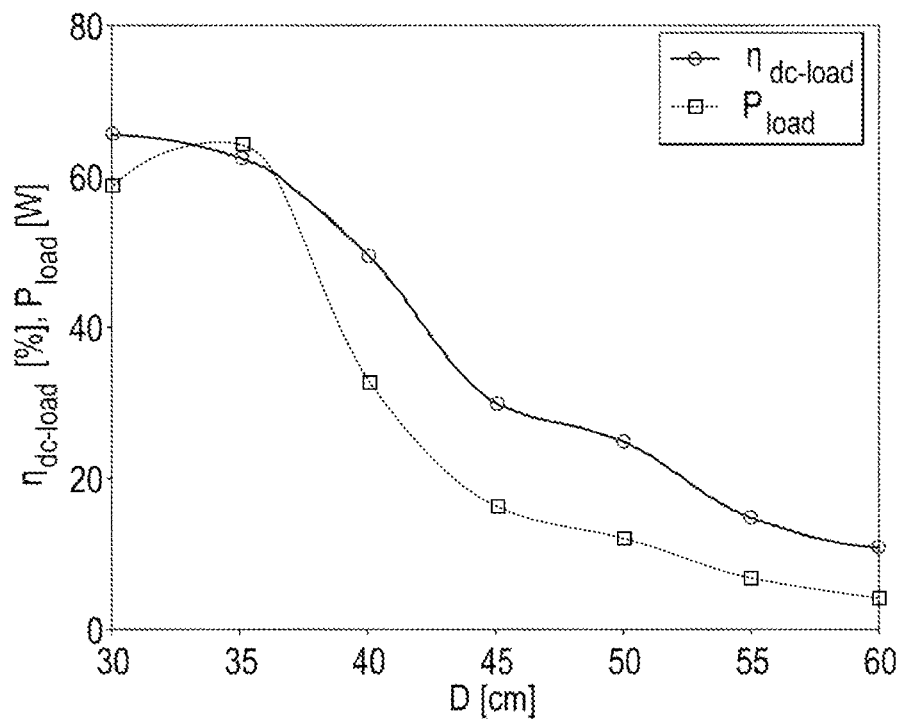
FIG. 14 illustrates measurement of the dc-to-load efficiency against separation distance with clock frequency tuning.

An easier tuning alternative is to change the operating frequency of the clock, thus relying on the semi-resonant operation of the driver. When this was performed, the receiver was no longer in resonance and the transmitter sees a reflected reactance. This extra reactance, in addition to the transmitter's reactance, was enough to improve the tuning of the semi-resonant Class-E driver, modifying $\omega_{cl}/\omega_{oTX}$ and shifting the driver's waveforms closer to zero-switching operation. As seen in FIG. 14, as the clock frequency was altered for each different measurement, the efficiency increased considerably over untuned operation. The dc-to-load efficiency from the clock-frequency tuned version at a 50 cm separation distance was 25%, compared to 20%, as seen in FIG. 13. It is important to note that to achieve this increase in efficiency, a clock frequency change of less than 1% was required.

Figure 15:
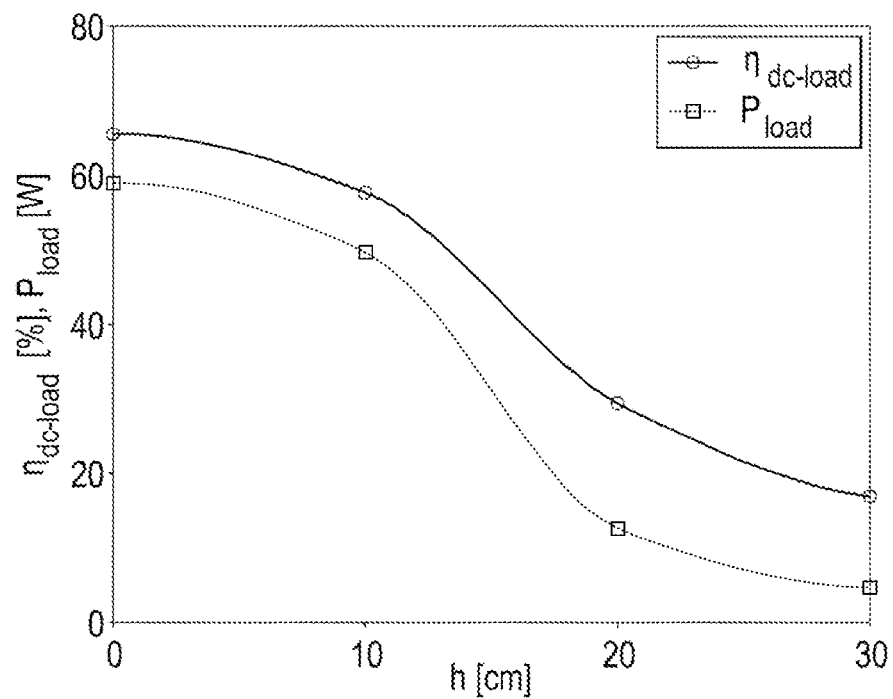
FIG. 15 illustrates measurement of the dc-to-load efficiency against coil transverse offset with fixed clock frequency tuning to aligned 30 cm separation distance scenario.

To analyse the efficiency of the IPT system, for a set of scenarios with different offsets, as shown in FIG. 2, measurements for both the perfectly aligned 30 cm impedance tuning with fixed clock frequency case and with clock frequency tuning were performed. FIG. 15 shows the results for IPT with different coil offsets. In this case, dc-to-load efficiency decreases; following a similar trend as the corresponding measurements above. It can be seen that even with an offset of 10 cm, and no additional tuning, the IPT system performed with a dc-to-load efficiency above 58%.

Figure 16:
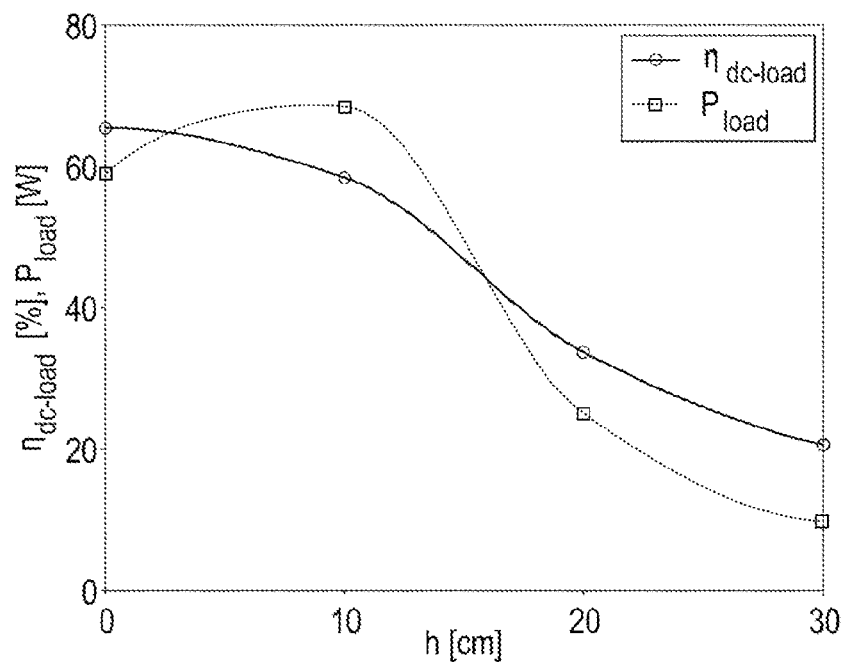
FIG. 16 illustrates measurement of the dc-to-load efficiency against coil transverse offset with only clock frequency tuning.

With clock frequency tuning, as shown in FIG. 16, the dc-to-load efficiency was above 50%, with h<14 cm, and an efficiency increase of 5% was achieved with an offset of 20 cm.

Although higher dc-to-load efficiencies could be achieved with tuning the optimal load for each offset, the results presented in this figure demonstrate that efficiencies above 50% can be achieved even at highly misaligned scenarios without the need for load tuning or complex and heavy coupling factor enhancement techniques.

Figure 17:
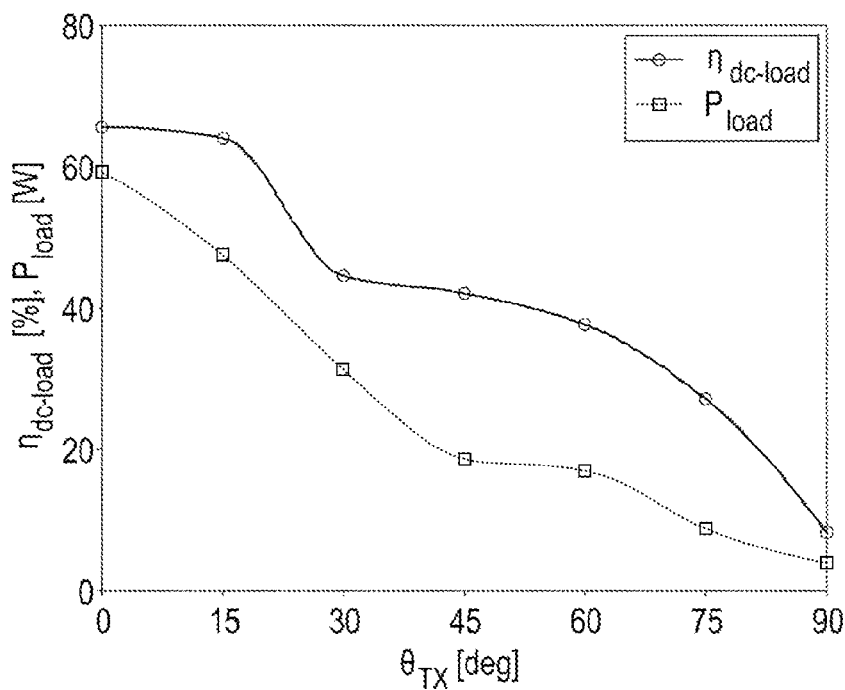
FIG. 17 illustrates measurement of the dc-to-load efficiency against TX coil angle with fixed clock frequency tuning to aligned 30 cm separation distance scenario.
Figure 18:
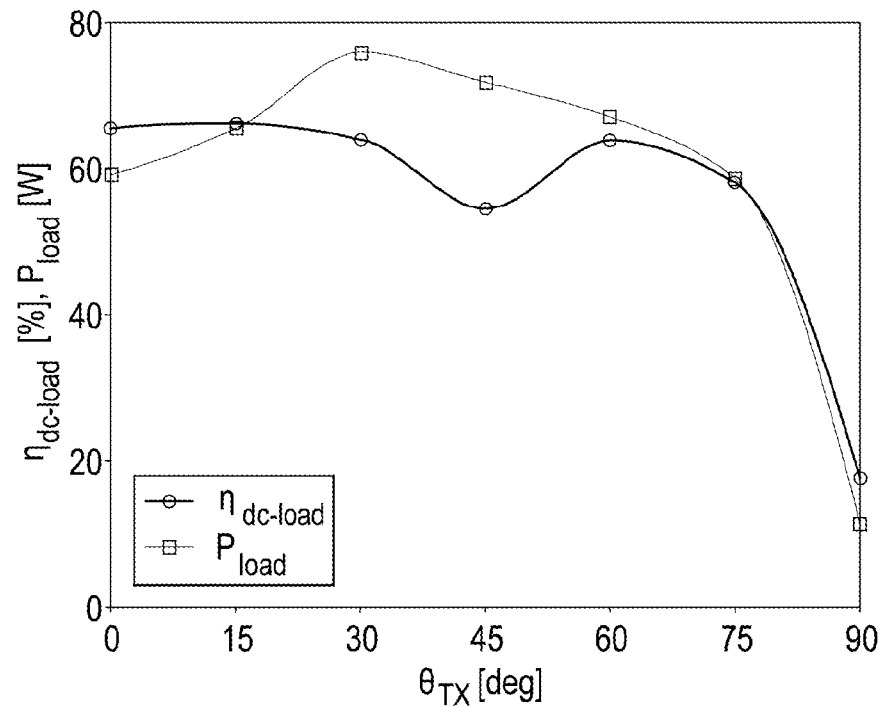
FIG. 18 illustrates measurement of the dc-to-load efficiency against TX coil angular misalignment with clock frequency tuning.

To characterise how the system operates while varying coil misalignment angle θ, in both transmitter and receiver, measurements at a fixed distance of D=30 cm were performed, as shown in FIG. 3. From FIGS. 17 and 18, measurements for a varying TX coil angle $\theta_{TX}$ were performed. As predicted, by the coupling factor measurements, a constant high efficiency was achieved for angles below 75 degrees when clock frequency tuning was performed. In contrast, a decrease in efficiency, not clearly linked with k was seen with the fixed clock frequency scenario. This is due to the fact that with the fixed clock frequency tuning case the presence of a larger reflecting load from the receiver influenced efficiency more than with the relatively large and constant coupling factor in the tuning of the IPT system. With the clock frequency tuning scenario, the frequency variation was enough to tune the Class-E and exploit the benefit of almost constant k. DC-to-load efficiencies above 60% were achieved for almost all $\theta_{TX}$<72 degrees with clock frequency tuning, showing the capabilities of the system to perform in a wide range of transmission angles with a fractional frequency variation of less than 6%.

Figure 19:
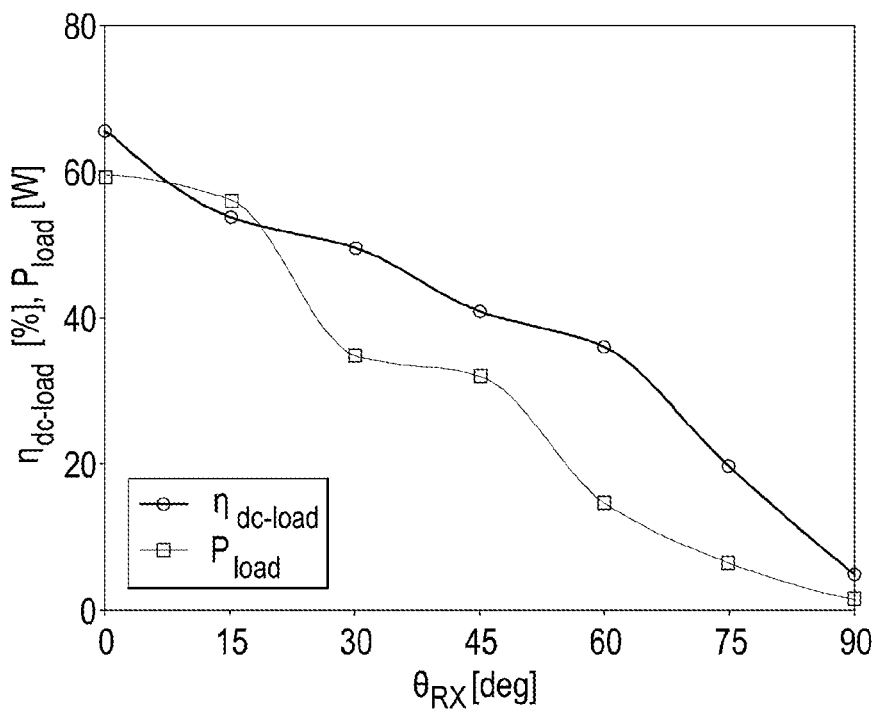
FIG. 19 illustrates measurement of the dc-to-load efficiency against RX coil angular misalignment with fixed clock frequency impedance tuning to aligned 30 cm separation distance scenario.
Figure 20:
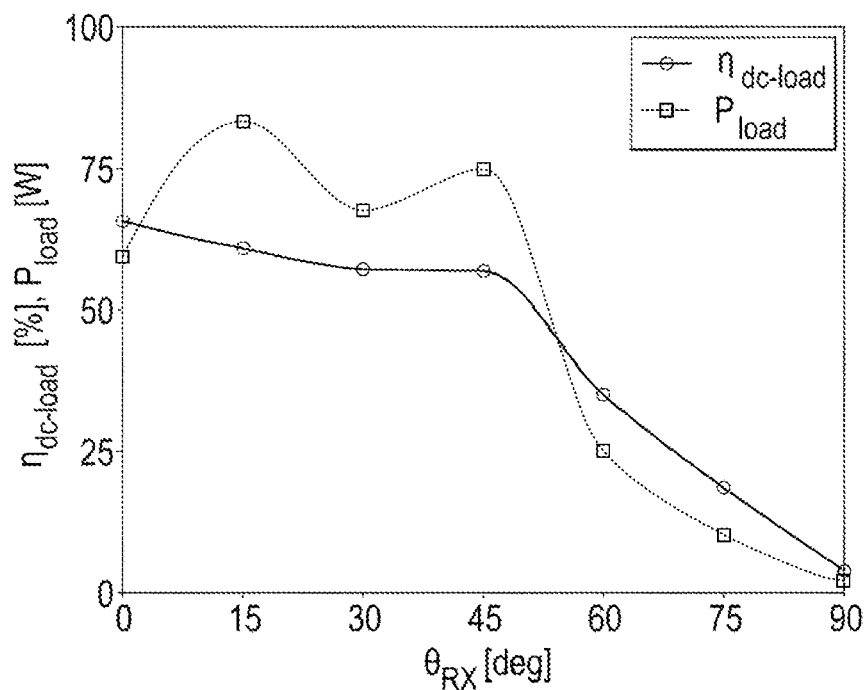
FIG. 20 illustrates measurement of the dc-to-load efficiency against RX coil angular misalignment with clock frequency tuning.

Finally, measurements with a varying $\theta_{RX}$ were performed, as shown in FIG. 19. The efficiency was almost constant and above 50% up to $\theta_{RX}$=52 degrees. Above this angle, the efficiency decreased dramatically, as predicted by the coupling factor measurements. A noticeable difference could be appreciated in FIG. 20, with $\theta_{RX}$=45 degrees, where the dc-to-load efficiency was 56% in the clock frequency tuned case and only 40% in the fixed clock frequency impedance tuned version.

Finally, the efficiency of the system was increased until the power dissipated by the load resistors caused them to overheat and fail. The highest dc-to-load efficiency achieved with the current prototype design was $\eta_{dc\text{-}load}$=77% for an aligned set of coils at a distance of 30 cm with $P_{load}$=105 W.

The calculated link efficiency based on the unloaded Q and k measurements was 95%. The dc-to-load efficiency of the system was increased thanks to a higher $V_{DD}$, which allowed $C_{oss}$=$C_{par}$. This avoided the use of an external capacitor and allowed for a higher $\omega_{cl}/\omega_{oTX}$, which increased the apparent driver inductance of the system. This is believed to be the highest dc-to-load efficiency ever presented for an IPT system, without k enhancement techniques.

A comparison of state-of-the-art IPT systems has been given above, a clear efficiency analysis is suggested for a meaningful comparison between competing solutions and key differences between link and dc-to-load efficiencies have been highlighted.

An indirect thermal method for measuring $P_{load}$ has been presented for the first time with an IPT system, to avoid measurement inaccuracies due to load resistance variations and high external electromagnetic fields in the current measurements.

This method was compared against the above coupling factor formula and well-known coupling factor measurements and a clear correlation can be seen, demonstrating the robustness of the efficiency measurement procedure. Low cost, high Q coils and a complete design and operational analysis of a semi-resonant Class-E driver for this IPT system has been described. The driver topology and component selection enabled high frequency, medium power, wireless power transfer for different transmitter and receiver coil sizes. A detailed transverse offset and angular misalignment characterization demonstrated efficiencies above 50% for transverse offsets up to 14 cm and $\theta_{RX}$=52 degrees.

Finally, dc-to-load efficiencies of 77% were demonstrated in a perfectly aligned scenario for D=30 cm, having a link efficiency of 95%.

Figure 21:
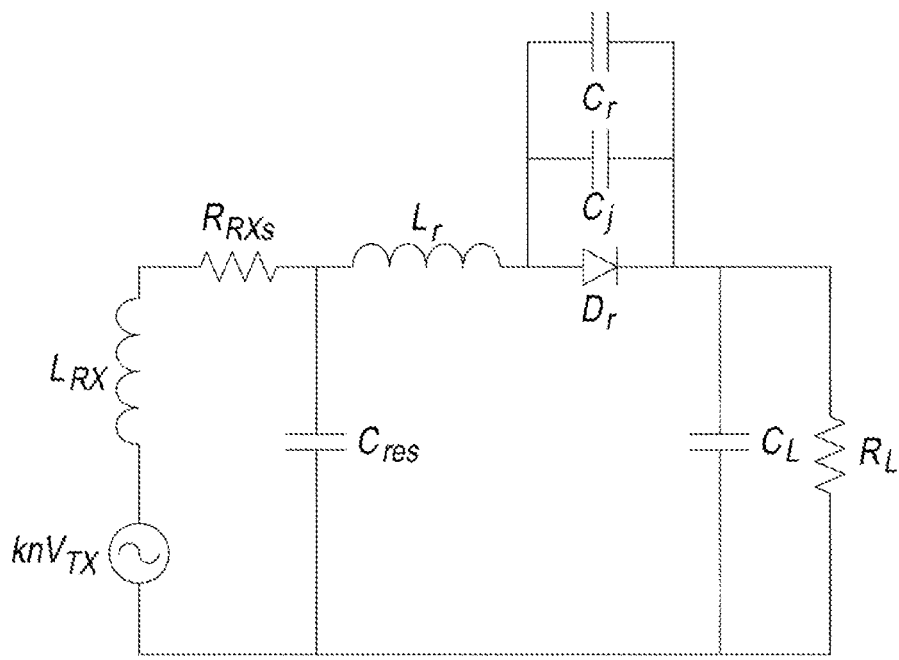
FIG. 21 is a schematic representation of Class E receiver circuit for use in an embodiment of the invention.

FIG. 21 is a schematic representation of a typical Class E receiver circuit according to an embodiment of the invention. The receiver circuit comprises the air core receiver coil RX of the inductive power transfer system described above. In FIG. 21, the inductance of the receiver coil RX is represented by the inductor $L_{RX}$ and the resistance of the receiver coil is represented by the resistor $R_{RXs}$. The induced signal in the receiver coil is represented by the signal generator kη$V_{TX}$ The resistor $R_L$ in FIG. 21 represents the load powered by the receiver circuit.

The receiver circuit comprises a first capacitor $C_L$ arranged in parallel with the load $R_L$. A secondary resonant tank circuit is provided in parallel with the first capacitor $C_L$. The tank circuit comprises the receiver coil and a second capacitor $C_{res}$ arranged in parallel with the receiver coil. In an alternative embodiment, the second capacitor $C_{res}$ is arranged in series, rather than parallel, with the receiver coil A first inductor $L_r$ is arranged in series with a first diode $D_r$ between the tank circuit and the first capacitor $C_L$. The junction capacitance of the first diode $D_r$ is represented in FIG. 21 by the capacitor $C_j$ in parallel with the first diode $D_r$. A third capacitor $C_r$ is arranged in parallel with the first diode $D_r$.

In traditional operation, the capacitance of the second capacitor $C_{res}$ is selected, such that the resonant frequency $\omega_{oRX}$ of the secondary tank circuit is equal to the first frequency $\omega_d$, i.e. the gate drive frequency of the transmitter circuit.

Figure 22:
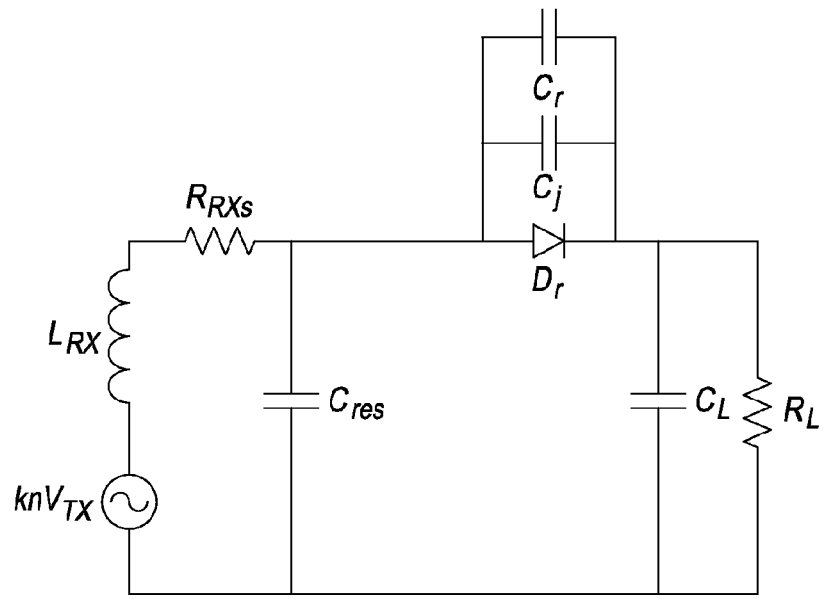
FIG. 22 is a schematic representation of Class E receiver circuit according to a further embodiment of the invention.

FIG. 22 is a schematic representation of Class E receiver circuit according to a further embodiment of the invention. This receiver circuit differs from the circuit of FIG. 21 in that the first inductor $L_r$ is not present. In addition, the capacitance of the second capacitor $C_{res}$ is selected, such that the resonant frequency $\omega_{oRX}$ of the secondary tank circuit differs from the first frequency $\omega_d$, the gate drive frequency of the transmitter circuit. The secondary tank circuit therefore operates in semi-resonance and maintains some inductive impedance which performs the role of the first inductor $L_r$ in the receiver circuit of FIG. 21. In this way, an inductor in addition to the receiver coil is not required. In the receiver circuit of FIG. 21, the first inductor $L_r$ generates a significant amount of heat because of the large AC current it carries. This potential source of power loss is therefore avoided in the receiver circuit of FIG. 22.

Figure 23:
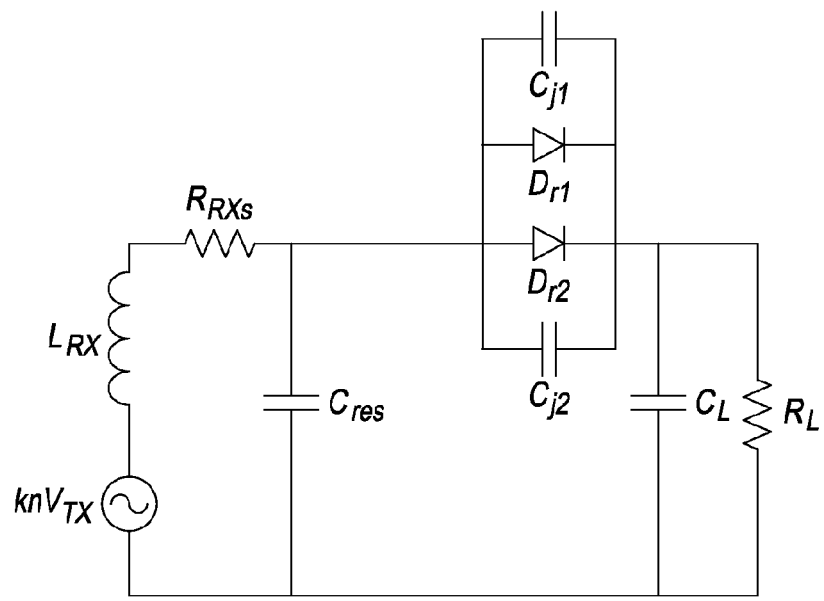
FIG. 23 is a schematic representation of Class E receiver circuit according to a yet further embodiment of the invention.

FIG. 23 is a schematic representation of Class E receiver circuit according to a yet further embodiment of the invention. This receiver circuit differs from the circuit of FIG. 22 in that the third capacitor $C_r$ is not present. Instead, a second diode is provided in parallel with the first diode. The junction capacitances $C_{j1}$, $C_{j2}$ of the two diodes provide the equivalent capacitance to the third capacitor $C_r$ and the junction capacitance $C_j$ in the circuit of FIGS. 21 and 22. In this way, the operation of the receiver circuit is not constrained by the maximum voltage of the third capacitor $C_r$. Silicon carbide (SiC) diodes provide the appropriate junction capacitance at the required operating voltages.

In the embodiment of FIGS. 22 and 23, the ratio $\omega_d/\omega_{oRX}$ of the first frequency $\omega_d$ to the resonant frequency $\omega_{oRX}$ of the receiver tank is in the range 0.2 to 3. This range allows the tuning of the rectifier circuit for a desired output voltage and efficiency across different input voltages and receiver coil inductances. The inductance $L_{RX}$ of the receiver coil is typically in the range 0.5 to 8 μH. The capacitance of the first capacitor $C_L$ is typically in the range 0.02 to 100 μF. The capacitance of the second capacitor $C_{res}$ is typically in the range 8 pF to 1.5 nF.

The transmitter circuit of FIG. 8 may be used in combination with the receiver circuits of any of FIGS. 21 to 23, but the circuit of FIG. 23 is presently preferred.

In summary, an inductive power transfer system comprises a transmitter coil TX and a receiver coil RX spaced from the transmitter coil. A transmitter circuit comprises the transmitter coil and is in the form of a Class E amplifier with a first inductor $L_{choke}$ and a transistor in series between the terminals of a power supply, a first transmitter capacitor $C_{par}$ in parallel with the transistor between the first inductor and a power supply terminal, a primary tank circuit in parallel with the first transmitter capacitor, the primary tank circuit comprising the transmitter coil and a second transmitter capacitor $C_{res}$ arranged in parallel or series with the transmitter coil, and a third transmitter capacitor $C_{ser}$ in series with the first inductor between the first transmitter capacitor and the primary tank circuit. The transistor is arranged to switch at a first frequency $\omega_d$ and the capacitance of the second transmitter capacitor is selected such that the resonant frequency $\omega_{oTX}$ of the primary tank circuit is greater than the first frequency. The receiver circuit comprises a Class E rectifier having a first receiver capacitor $C_L$ arranged in parallel with a load $R_L$ and a secondary tank circuit in parallel with the first receiver capacitor. The secondary tank circuit comprises the receiver coil and a second receiver capacitor $C_{res}$ arranged in parallel or series with the receiver coil. A first diode $D_{r2}$ is provided between the secondary tank circuit and the first receiver capacitor. The capacitance of the second receiver capacitor is selected such that the resonant frequency $\omega_{oRX}$ of the secondary tank circuit differs from the first frequency, so that the secondary tank circuit operates in semi-resonance and maintains some reactive impedance. The transmitter circuit is configured to vary the first frequency, in order to achieve a desired impedance of the primary tank circuit.

Throughout the description and claims of this specification, the words "comprise" and "contain" and variations of them mean "including but not limited to", and they are not intended to (and do not) exclude other components, integers or steps. Throughout the description and claims of this specification, the singular encompasses the plural unless the context otherwise requires. In particular, where the indefinite article is used, the specification is to be understood as contemplating plurality as well as singularity, unless the context requires otherwise.

Features, integers, characteristics or groups described in conjunction with a particular aspect, embodiment or example of the invention are to be understood to be applicable to any other aspect, embodiment or example described herein unless incompatible therewith. All of the features disclosed in this specification (including any accompanying claims, abstract and drawings), and/or all of the steps of any method or process so disclosed, may be combined in any combination, except combinations where at least some of such features and/or steps are mutually exclusive. The invention is not restricted to the details of any foregoing embodiments. The invention extends to any novel one, or any novel combination, of the features disclosed in this specification (including any accompanying claims, abstract and drawings), or to any novel one, or any novel combination, of the steps of any method or process so disclosed.

The work leading to this invention has received funding from the European Union Seventh Framework Programme FP7/2007-2013 under grant agreement no. 223975.

REFERENCES

[1] N. Tesla, "Apparatus for transmitting electrical energy," U.S. Pat. No. 1,119,732, 1914.
[2] K. V. Schuylenbergh and R. Puers, Inductive Powering: Basic Theory and Application to Biomedical Systems. Springer, July 2009.
[3] S. Y. R. Hui and W. C. Ho, "A new generation of universal contactless battery charging platform for portable consumer electronic equipment," in *Power Electron. Specialists Conf., 2004. PESC 04. 2004 IEEE 35th Annual*, vol. 1, June 2004, pp. 638-644.
[4] D. Schneider, "Wireless power at a distance is still far away [electrons unplugged]," *Spectrum, IEEE*, vol. 47, no. 5, pp. 34-39, May 2010.
[5] G. Covic, G. Elliott, O. Stielau, R. Green, and J. Boys, "The design of a contact-less energy transfer system for a people mover system," in *Proc. PowerCon 2000, Int. Conf. on Power Syst. Tech.*, vol. 1, 2000, pp. 79-84.
[6] M. Budhia, G. A. Covic, and J. T. Boys, "Design and optimization of circular magnetic structures for lumped inductive power transfer systems," *IEEE Trans. Power Electron.*, vol. 26, no. 11, pp. 3096-3108, November 2011.

[7] A. Karalis, J. D. Joannopoulos, and M. Soljacic, "Efficient wireless non-radiative mid-range energy transfer," *Annals of Physics*, vol. 323, no. 1, pp. 34-48, 2008.

[8] B. Wang, K. H. Teo, T. Nishino, W. Yerazunis, J. Barnwell, and J. Zhang, "Experiments on wireless power transfer with metamaterials," *Applied Physics Letters*, vol. 98, no. 25, June 2011.

[9] A. Kurs, A. Karalis, R. Moffatt, J. D. Joannopoulos, P. Fisher, and M. Soljacic, "Wireless power transfer via strongly coupled magnetic resonances," *Science*, vol. 317, no. 5834, pp. 83-86, July 2007.

[10] S. H. Lee and R. D. Lorenz, "Development and validation of model for 95% efficiency, 220 W wireless power transfer over a 30-cm air-gap," *IEEE Trans. on Ind. Appl.*, vol. 47, no. 6, pp. 2495-2504, September 2011.

[11] N. Y. Kim and K. Y. Kim, "Automated frequency tracking system for efficient mid-range magnetic resonance wireless power transfer," *Microwave and Optical*, vol. 54, no. 6, pp. 1423-1426, June 2012.

[12] Z. N. Low, R. Chinga, R. Tseng, and J. Lin, "Design and test of a high power high-efficiency loosely coupled planar wireless power transfer system," *IEEE Trans. Ind. Electron.*, vol. 56, no. 5, pp. 1801-1812, May 2009.

[13] J. J. Casanova, Z. N. Low, and J. Lin, "Design and optimization of a Class-E amplifier for a loosely coupled planar wireless power system," *IEEE Trans. on Circuits and Syst. II: Express Briefs*, vol. 56, no. 11, pp. 830-834, November 2009.

[14] "Plugless Power," February 2012. [Online]. Available: http://www.pluglesspower.com/

[15] T. P. Duong and J. W. Lee, "Experimental results of high-efficiency resonant coupling wireless power transfer using a variable coupling method," *IEEE Trans. Microw. Wireless Compon. Lett.*, vol. 21, no. 8, pp. 442-444, August 2011.

[16] J. L. Villa, J. Sallan, J. F. Sanz Osorio, and A. Llombart, "High misalignment tolerant compensation topology for ICPT systems," *IEEE Trans. Ind. Electron.*, vol. 59, no. 2, pp. 945-951, February 2012.

[17] "WiTricity Corp." February 2012. [Online]. Available: http://www.witricity.com/

[18] "Delphi wireless charging system," May 2012. [Online]. Available: http://delphi.com/shared/pdf/ppd/pwrelec/wireless-charging-system.pdf

[19] A. Karalis, A. B. Kurs, R. Moffatt, J. D. Joannopoulos, P. Fisher, and M. Soljacic, "Power Supply System and Method of Controlling Power Supply System," U.S. Patent 20 110 221 278, 2011.

[20] L. Chen, S. Liu, Y. Zhou, and T. Cui, "An optimizable circuit structure for high-efficiency wireless power transfer," *IEEE Trans. Ind. Electron.*, vol. PP, no. 99, pp. 1-1, December 2011.

[21] S. Ahn and J. Kim, "Magnetic field design for high efficient and low EMF wireless power transfer in on-line electric vehicle," in *Proc. of the 5th European Conf. on Antennas and Propag. (EUCAP)*, April 2011, pp. 3979-3982.

[22] J. J. Huh, S. W. Lee, W. Y. Lee, G. H. Cho, and C. T. Rim, "Narrow width inductive power transfer system for online electrical vehicles," *IEEE Trans. on Power Electron.*, vol. 26, no. 12, pp. 3666-3679, December 2011.

[23] "Qualcomm," February 2012. [Online]. Available: http://www.qualcomm.com/

[24] "HaloIPT," February 2012. [Online]. Available: http://www.haloipt.com/#n home-intro

[25] A. P. Sample, D. A. Meyer, and J. R. Smith, "Analysis, experimental results, and range adaptation of magnetically coupled resonators for wireless power transfer," *IEEE Trans. Ind. Electron.*, vol. 58, no. 2, pp. 544-554, February 2011.

[26] J. Garnica, J. Casanova, and J. Lin, "High efficiency midrange wireless power transfer system," in Microwave Workshop Series on Innovative Wireless Power Transmission: Technologies, Systems, and Applications (IMWS), 2011 IEEE MTT-S International, May 2011, pp. 73-76.

[27] D. C. Yates, A. S. Holmes, and A. J. Burdett, "Optimal transmission frequency for ultralow-power short-range radio links," *IEEE Trans. on Circ. and Syst. I: Regular Papers*, vol. 51, no. 7, pp. 1405-1413, July 2004.

[28] M. Pinuela, D. C. Yates, P. D. Mitcheson, and S. Lucyszyn, "Maximising the link efficiency of resonant inductive coupling for wireless power transfer," in *1st International Workshop on Wireless Energy Transport and Harvesting*, Eindhoven, The Netherlands, June 2011.

[29] D. Kajfez, S. Chebolu, M. R. Abdul-Gaffoor, and A. A. Kishk, "Uncertainty analysis of the transmission-type measurement of Q-factor," *IEEE Trans. Microw. Theory Tech.*, vol. 47, no. 3, pp. 367-371, March 1999.

[30] C. A. Balanis, *Antenna Theory: Analysis and Design*, 3rd ed. John Wiley, 2005.

[31] S. Butterworth, "On the alternating current resistance of solenoidal coils," *Proceedings of the Royal Society of London. Series A, Containing Papers of a Mathematical and Physical Character*, vol. 107, no. 744, pp. 693-715, April 1925.

[32] N. O. Sokal and A. D. Sokal, "Class E-A new class of high-efficiency tuned single-ended switching power amplifiers," *IEEE J. of Solid-State Circuits*, vol. 10, no. 3, pp. 168-176, June 1975.

[33] N. O. Sokal, "Class-E RF power amplifiers," *QEX Commun. Quart*, no. 204, pp. 9-20, January 2001.

[34] M. W. Vania, "PRF-1150 1 KW 13.56 MHz Class E RF generator evaluation module," Directed Energy, Inc., Technical Note 9200-0255 Rev. 1, 2002.

[35] "Agilent N2780A/B, N2781A/B, N2782A/B, and N2783A/B current probes, user's and service guide," Agilent Technologies Inc., U.S.A., 2010.

[36] S. Rea and S. West, "Thermal radiation from finned heat sinks," *IEEE Trans. Parts, Hybrids, and Packag.*, vol. 12, no. 2, pp. 115-117, June 1976

The invention claimed is:

1. An inductive power transfer system comprising:
   a transmitter circuit comprising a transmitter coil; and
   a receiver circuit comprising a receiver coil spaced from the transmitter coil,
   wherein the transmitter circuit is in the form of a Class E amplifier comprising:
   a first inductor and a transistor in series between the terminals of a power supply, the transistor being arranged to switch at a first frequency;
   a first transmitter capacitance in parallel with the transistor between the first inductor and a power supply terminal;
   a primary tank circuit in parallel with the first transmitter capacitance, the primary tank circuit comprising the transmitter coil and a second transmitter capacitance arranged in parallel or series with the transmitter coil;
   a third transmitter capacitance in series with the first inductor between the first transmitter capacitance and the primary tank circuit,
   wherein the second transmitter capacitance is selected such that a resonant frequency of the primary tank circuit is not equal to the first frequency.

2. An inductive power transfer system as claimed in claim 1, wherein the second transmitter capacitance is arranged in parallel with the transmitter coil, and wherein the second transmitter capacitance is selected such that the resonant frequency of the primary tank circuit is greater than the first frequency.

3. An inductive power transfer system as claimed in claim 1, wherein the second transmitter capacitance is arranged in series with the transmitter coil, and wherein the second transmitter capacitance is selected such that the resonant frequency of the primary tank circuit is less than the first frequency.

4. An inductive power transfer system as claimed in claim 2, wherein the ratio of the first frequency to the resonant frequency of the primary tank circuit is greater than or equal to 0.5 and less than 1.

5. An inductive power transfer system as claimed in claim 3, wherein the ratio of the first frequency to the resonant frequency of the primary tank circuit is greater than 1 and less than or equal to 1.5.

6. An inductive power transfer system as claimed in claim 1, wherein the receiver circuit has a resonant frequency and the transmitter circuit is configured to vary the first frequency in order to achieve a desired effective impedance of the primary tank circuit.

7. An inductive power transfer system as claimed in claim 1, wherein at least one of the transmitter coil and the receiver coil has an air core.

8. An inductive power transfer system as claimed in claim 1, wherein at least one of the transmitter coil and the receiver coil has a diameter of at least 5 cm.

9. An inductive power transfer system as claimed in claim 8, wherein at least one of the transmitter coil and the receiver coil has a diameter of at least 10 cm.

10. An inductive power transfer system as claimed in claim 1, wherein the spacing between the transmitter coil and the receiver coil, in use, is at least 15 cm.

11. An inductive power transfer system as claimed in claim 1, wherein the transistor is a MOSFET.

12. An inductive power transfer system as claimed in claim 1, wherein the first frequency is at least 80 kHz.

13. An inductive power transfer system as claimed in claim 12, wherein the first frequency is at least 1 MHz.

14. An inductive power transfer system as claimed in claim 1, wherein the power transferred between the transmitter coil and the receiver coil is at least 1 watt.

15. An inductive power transfer system as claimed in claim 14, wherein the power transferred between the transmitter coil and the receiver coil is at least 10 watts.

16. An inductive power transfer system as claimed in claim 1, wherein the receiver circuit comprises a Class E rectifier.

17. An inductive power transfer system as claimed in claim 16, wherein:
the receiver circuit comprises a first receiver capacitance and a secondary tank circuit in parallel with the first receiver capacitance;
the receiver circuit is arranged to receive a load in parallel with the first receiver capacitance; and
the secondary tank circuit comprises the receiver coil and a second receiver capacitance arranged in parallel with the receiver coil, and a first diode is provided between the secondary tank circuit and the first receiver capacitance.

18. An inductive power transfer system as claimed in claim 17, wherein the second receiver capacitance is selected such that the resonant frequency of the secondary tank circuit differs from the first frequency, whereby the secondary tank circuit operates in semi-resonance and maintains some reactive impedance.

19. An inductive power transfer system as claimed in claim 18, wherein the ratio of the first frequency to the resonant frequency of the secondary tank circuit is in the range 0.2 to 3.

20. An inductive power transfer system as claimed in claim 17, wherein the receiver circuit comprises at least a second diode in parallel with the first diode.

21. An inductive power transfer system as claimed in claim 16, wherein the only inductor in the receiver circuit is the receiver coil.

22. An inductive power transfer system as claimed in claim 16, wherein the Class E rectifier comprises at least one diode and the only capacitance in parallel with the at least one diode is provided by junction capacitance of the at least one diode.

23. An inductive power transfer system as claimed in claim 16, wherein the Class E rectifier comprises at least one diode and the at least one diode is a silicon carbide diode, gallium nitride diode or is formed of another wide band gap material.

24. An inductive power transfer system as claimed in claim 1, wherein the first transmitter capacitance is formed of the output capacitance of the transistor.

25. A receiver circuit for use in an inductive power transfer system, the receiver circuit comprising a receiver coil and being in the form of a Class E rectifier comprising a first receiver capacitance arranged in parallel with a load and a secondary tank circuit in parallel with the first receiver capacitance, wherein the secondary tank circuit comprises the receiver coil and a second receiver capacitance arranged in parallel with the receiver coil, and a first diode is provided between the secondary tank circuit and the first receiver capacitance.

26. A receiver circuit as claimed in claim 25, wherein the receiver circuit is for use with a transmitter circuit comprising a transistor arranged to switch at a first frequency and wherein the second receiver capacitance in the receiver is selected such that the resonant frequency of the secondary tank circuit differs from the first frequency, whereby the secondary tank circuit operates in semi-resonance and maintains some reactive impedance.

27. A receiver circuit as claimed in claim 26, wherein the ratio of the first frequency to the resonant frequency of the secondary tank circuit is in the range 0.2 to 3.

28. A receiver circuit as claimed in claim 25, wherein the only inductor in the receiver circuit is the receiver coil.

29. A receiver circuit as claimed in claim 25, wherein the receiver circuit comprises at least a second diode in parallel with the first diode.

30. A receiver circuit as claimed in claim 25, wherein the Class E rectifier comprises at least one diode and the only capacitance in parallel with the at least one diode is provided by junction capacitance of the at least one diode.

31. A receiver circuit as claimed in claim 25, wherein the Class E rectifier comprises at least one diode and the at least one diode is a silicon carbide diode, gallium nitride diode or is formed of another wide band gap material.

32. A receiver circuit as claimed in claim 25, wherein the receiver coil has an air core.

33. A receiver circuit as claimed in claim 25, wherein the receiver coil has a diameter of at least 5 cm.

34. A receiver circuit as claimed in claim 25, wherein the receiver coil has a diameter of at least 10 cm.

35. A transmitter for use in an inductive power transfer system, the transmitter circuit comprising a transmitter coil and being in the form of a Class E amplifier comprising:
- a first inductor and a transistor in series between the terminals of a power supply, the transistor being arranged to switch at a first frequency;
- a first transmitter capacitance in parallel with the transistor between the first inductor and a power supply terminal;
- a primary tank circuit in parallel with the first transmitter capacitance, the primary tank circuit comprising the transmitter coil and a second transmitter capacitance arranged in parallel or series with the transmitter coil;
- a third transmitter capacitance in series with the first inductor between the first transmitter capacitance and the primary tank circuit,
- wherein the second transmitter capacitance is selected such that the resonant frequency of the primary tank circuit is not equal to the first frequency.

36. A transmitter circuit as claimed in claim 35, wherein the second transmitter capacitance is arranged in parallel with the transmitter coil, and wherein the second transmitter capacitance is selected such that the resonant frequency of the primary tank circuit is greater than the first frequency.

37. A transmitter circuit as claimed in claim 36, wherein the ratio of the first frequency to the resonant frequency of the primary tank circuit is greater than or equal to 0.5 and less than 1.

38. A transmitter circuit as claimed in claim 35, wherein the second transmitter capacitance is arranged in series with the transmitter coil, and wherein the second transmitter capacitance is selected such that the resonant frequency of the primary tank circuit is less than the first frequency.

39. A transmitter circuit as claimed in claim 38, wherein the ratio of the first frequency to the resonant frequency of the primary tank circuit is greater than 1 and less than or equal to 1.5.

40. A transmitter circuit as claimed in claim 35, wherein the transmitter circuit is for use with a receiver circuit having a resonant frequency and the transmitter circuit is configured to vary the first frequency, in order to achieve a desired effective impedance of the primary tank circuit.

41. A transmitter circuit as claimed in claim 35, wherein the transmitter coil has an air core.

42. A transmitter circuit as claimed in claim 35, wherein the transmitter coil has a diameter of at least 5 cm.

43. A transmitter circuit as claimed in claim 42, wherein the transmitter coil has a diameter of at least 10 cm.

44. A transmitter circuit as claimed in claim 35, wherein the transistor is a MOSFET.

45. A transmitter circuit as claimed in claim 35, wherein the first frequency is at least 80 kHz.

46. A transmitter circuit as claimed in claim 45, wherein the first frequency is at least 1 MHz.

47. A transmitter circuit as claimed in claim 35, wherein the first transmitter capacitance is formed of the output capacitance of the transistor.

* * * * *